(12) United States Patent
Hwang et al.

(10) Patent No.: US 9,147,823 B2
(45) Date of Patent: Sep. 29, 2015

(54) THERMOELECTRIC NANOCOMPOSITE, THERMOELECTRIC ELEMENT, AND THERMOELECTRIC MODULE

(75) Inventors: Sung-woo Hwang, Yongin-si (KR); Kyu-hyoung Lee, Yongin-si (KR); Sang-mock Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 393 days.

(21) Appl. No.: 13/563,292

(22) Filed: Jul. 31, 2012

(65) Prior Publication Data

US 2013/0032190 A1 Feb. 7, 2013

(30) Foreign Application Priority Data

Aug. 3, 2011 (KR) ........................ 10-2011-0077372

(51) Int. Cl.
 *H01L 35/16* (2006.01)
 *H01L 35/26* (2006.01)
 *B82Y 15/00* (2011.01)
(52) U.S. Cl.
 CPC ................ *H01L 35/16* (2013.01); *H01L 35/26* (2013.01); *B82Y 15/00* (2013.01)
(58) Field of Classification Search
 None
 See application file for complete search history.

(56) References Cited

U.S. PATENT DOCUMENTS

2008/0173344 A1* 7/2008 Zhang et al. .................. 136/238
2012/0111385 A1* 5/2012 Ramanath et al. ............ 136/200

FOREIGN PATENT DOCUMENTS

| CN | 101746738 A | 9/2009 |
|----|----|----|
| JP | 2007031189 A | 7/2005 |
| JP | 2011035259 A | 8/2009 |
| KR | 1020020008210 A | 1/2002 |
| KR | 1020110018102 A | 2/2011 |
| WO | 2007/066820 A1 | 6/2007 |
| WO | WO 2011022189 A2 * | 2/2011 |
| WO | WO 2011057341 A1 * | 5/2011 |

OTHER PUBLICATIONS

J. S. Bendall, et al., "Layer-by-layer all-inorganic quantum-dot-based LEDs: A simple procedure with robust performance", Advanced Functional Materials 20, p. 3298-3302 (2010).*
R. Ma, et al "Exfoliating layered double hydroxides in formamide: a method to obtain positively charged nanosheets", Journal of Materials Chemistry 16, p. 3809-3813 (2006).*
Definition of matrix [retrieved from internet at http://www.dddmag.com/content/glossary-drug-discovery-and-development-terms on Sep. 29, 2014].*
J. Liu, et al., "Facile and large scale production of zno/zn—al layered double hydroxide hierarchical heterostructures", Journal of Physical Chemistry B 110, p. 21865-21872 (2006).*
X. A. Fan, et al., "Bi2Te3 hexagonal nanoplates and thermoelectric properties of n-type Bi2Te3 nanocomposites", Journal of Physics D: Applied Physics 40, p. 5975-5979 (2007).*

(Continued)

*Primary Examiner* — Jeffrey T Barton
*Assistant Examiner* — Eric R Smith
(74) *Attorney, Agent, or Firm* — Cantor Colburn LLP

(57) ABSTRACT

A thermoelectric material including a thermoelectric semiconductor; and a nanosheet disposed in the thermoelectric semiconductor, the nanosheet having a layered structure and a thickness from about 0.1 to about 10 nanometers. Also a thermoelectric element and thermoelectric module including the thermoelectric material.

25 Claims, 21 Drawing Sheets

(56) References Cited

OTHER PUBLICATIONS

T. Kameyama, et al., "Stacked-structure-dependent photoelectrochemical properties of CdS nanoparticle/layered double hydroxide (LDH) nanosheet multilayer films prepared by layer-by-layer accumulation", Physical Chemistry Chemical Physics 11, p. 5369-5376 (2009).*

Hsu et al., "Cubic $AgPb_mSbTe_{2+m}$: Bulk Thermoelectric Materials with High Figure of Merit", Science, vol. 303, Feb. 6, 2004, pp. 818-821.

Iyi, et al., "Deintercalation of Carbonate Ions from a Hydrotalcite-Like Compound: Enhanced Decarbonation Using Acid-Salt Mixed Solution", Chem. Mater., vol. 16, 2004, pp. 2926-2932.

Li et al., "Positively Charged Nanosheets Derived via Total Delamination of Layered Double Hydroxides", Chem. Mater., vol. 17, 2005, pp. 4386-4391.

Poudel et al., "High-Thermoelectric Performance of Nanostructured Bismuth Antimony Telluride Bulk Alloys", Science, vol. 320, May 2, 2008, pp. 634-638.

Yang et al., "A study by in situ techniques of the thermal evolution of the structure of a Mg—Al—$CO_3$ layered double hydroxide", Chemical Engineering Science, vol. 57, 2002, pp. 2945-2953.

* cited by examiner

BULK THERMOELECTRIC MATERIAL → INTRODUCE NANOSHEET → THERMOELECTRIC NANOCOMPOSITE

TEM IMAGE

METAL HYDROXIDE LAYER

NEGATIVE ION LAYER

THERMOELECTRIC NANOCOMPOSITE, THERMOELECTRIC ELEMENT, AND THERMOELECTRIC MODULE

CROSS-REFERENCE TO RELATED APPLICATIONS

This application claims priority to and the benefit of Korean Patent Application No. 10-2011-0077372, filed on Aug. 3, 2011, and all the benefits accruing therefrom under 35 U.S.C. §119, the content of which is incorporated herein in its entirety by reference.

BACKGROUND

1. Field

The present disclosure relates to a thermoelectric material, a thermoelectric element including the thermoelectric material, and methods of preparing the thermoelectric element, and a thermoelectric module including the same.

2. Description of the Related Art

The thermoelectric effect is the reversible and direct conversion of energy between heat and electricity and is generated as an electron and a hole move in a thermoelectric material. The thermoelectric effect is classified as the Peltier effect, which provides cooling using a temperature difference between ends of a thermoelectric material due to an applied electric current, and the Seebeck effect, which provides power generation using an electromotive force generated from a temperature difference between ends of a thermoelectric material.

A current thermoelectric material is used in a semiconductor apparatus to provide a passive cooling system, and in an electronic device to provide an active cooling system. Demands for an improved thermoelectric material are increasing for cooling applications where a refrigerant gas compression method is unsuitable. Thermoelectric cooling technology is an environmentally friendly cooling technology with no vibration and low noise, and avoids use of a refrigerant gas, which can cause environmental problems. Still there remains a need for an improved thermoelectric material. A higher efficiency thermoelectric cooling material would provide for an expanded range of applications, including general-use cooling, such as in a refrigerator or an air conditioner. Also, a thermoelectric power generating material may be applied where heat is emitted, such as in a car engine or in an industrial factory, to generate power from a temperature difference generated at opposite ends of the thermoelectric power generating material. Thus the thermoelectric power generating material is also receiving attention as a new energy source.

SUMMARY

Provided is a thermoelectric material having improved thermoelectric conversion efficiency.

Provided is a thermoelectric element including the thermoelectric material.

Provided is a thermoelectric module including the thermoelectric element.

Additional aspects, features, and advantages will be set forth in part in the description which follows and, in part, will be apparent from the description.

According to an aspect, a thermoelectric material includes: a thermoelectric semiconductor; and a nanosheet disposed in the thermoelectric semiconductor, the nanosheet having a layered structure and a thickness from about 0.1 to about 10 nanometers (nm).

A distance between layers in the layered structure may be from about 1 to about 40 angstroms (Å).

An average area of the nanosheet may be from about 0.0001 to about 100 square micrometers ($\mu m^2$).

The nanosheet may include a layered material including a metal hydroxide.

The nanosheet may include a layered double hydroxide (LDH) represented by Formula 1:

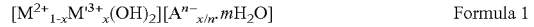

$$[M^{2+}_{1-x}M'^{3+}_{x}(OH)_2][A^{n-}_{x/n} \cdot mH_2O] \qquad \text{Formula 1}$$

wherein $M^{2+}$ denotes a divalent metal ion, $M'^{3+}$ denotes a trivalent metal ion, $A^{n-}$ denotes an inorganic anion having a valence of n, $0.2 \leq x \leq 0.33$, n is an integer from 1 to 3, and $0.5 \leq m \leq 4$.

$M^{2+}$ may be selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof, $M'^{3+}$ may be selected from $Al^{3+}$, $Cr^{3+}$, $Mn^{3+}$, $Fe^{3+}$, $Co^{3+}$, $Ni^{3+}$, $La^{3+}$, and a combination thereof, and $A^{n-}$ may be selected from $CO_3^{2-}$, $OH^-$, $NO_3^-$, $SO_4^{2-}$, $ClO_4^-$, $WO_4^{2-}$, and a combination thereof.

The thermoelectric semiconductor may include an element selected from a transition metal, a rare earth element, a Group 13 element, a Group 14 element, a Group 15 element, and a Group 16 element, and a combination thereof.

The thermoelectric semiconductor may include a thermoelectric semiconductor selected from a Bi—Te-containing material, a Co—Sb-containing material, a Pb—Te-containing material, a Ge—Tb-containing material, a Si—Ge-containing material, a Sb—Te-containing material, a Sm—Co-containing material, a transition metal silicide-containing material, and a combination thereof.

An average particle diameter of the thermoelectric semiconductor may be about 0.01 micrometer ($\mu m$) to about 100 $\mu m$.

According to another aspect, a thermoelectric material includes: a thermoelectric semiconductor; and a metal hydroxide having a layered structure.

The metal hydroxide may be a layered double hydroxide (LDH) represented by Formula 1:

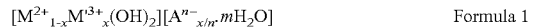

$$[M^{2+}_{1-x}M'^{3+}_{x}(OH)_2][A^{n-}_{x/n} \cdot mH_2O] \qquad \text{Formula 1}$$

wherein $M^{2+}$ denotes a divalent metal ion, $M'^{3+}$ denotes a trivalent metal ion, $A^{n-}$ denotes an organic anion having a valence of n, $0.2 \leq x \leq 0.33$, n is an integer from 1 to 3, and $0.5 \leq m \leq 4$.

$M^{2+}$ may be selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof, $M'^{3+}$ may be selected from $Al^{3+}$, $Cr^{3+}$, $Mn^{3+}$, $Fe^{3+}$, $Co^{3+}$, $Ni^{3+}$, $La^{3+}$, and a combination thereof, $A^{n-}$ may be selected from $CO_3^{2-}$, $OH^-$, $NO_3^-$, $SO_4^{2-}$, $ClO_4^-$, $WO_4^{2-}$, and a combination thereof.

A distance between layers in the layered structure may be about 1 to about 40 Å.

A thickness of the metal hydroxide may be about 0.1 to about 50 nm.

According to another aspect, a thermoelectric element includes the thermoelectric material disclosed above.

The thermoelectric element may have a monolithic shape.

The thermoelectric semiconductor may form a matrix, and the nanosheet or metal hydroxide may be dispersed in the matrix.

The nanosheet or metal hydroxide may be disposed on a grain boundary of the thermoelectric semiconductor.

According to another aspect, a thermoelectric module includes: a first electrode; a second electrode facing the first electrode; and the thermoelectric element disclosed above disposed between the first electrode and the second electrode.

Also disclosed is a method of manufacturing a thermoelectric material, the method including: providing a thermoelectric semiconductor; providing a nanosheet derived from a layered double hydroxide; combining the thermoelectric semiconductor and the nanosheet to form a combination; and heating the combination to manufacture the thermoelectric material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
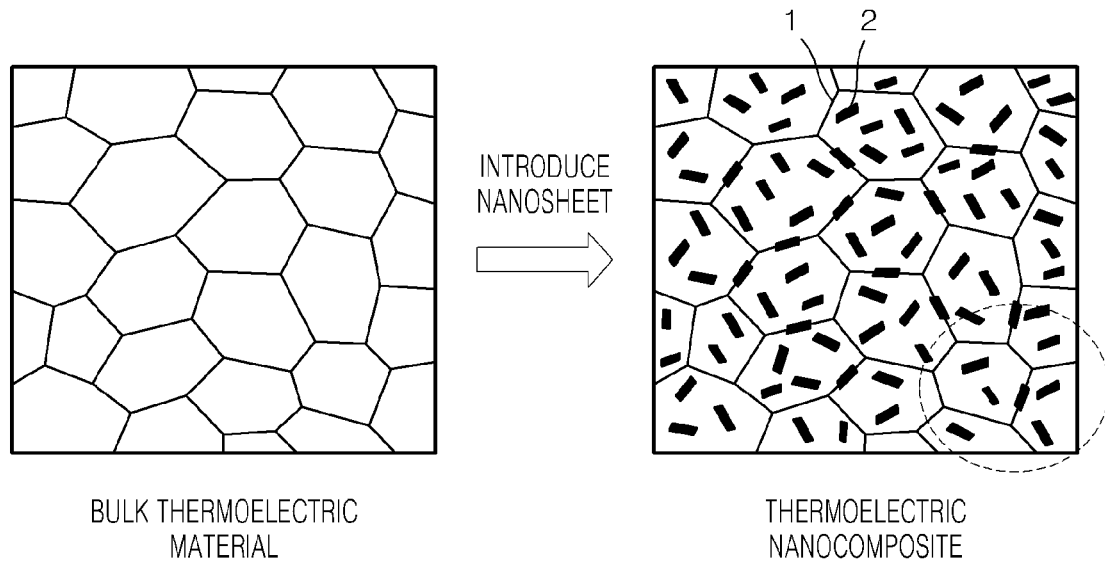
FIG. 1 is a schematic diagram of an embodiment of a method of preparing a thermoelectric element by introducing a nanosheet into a thermoelectric semiconductor.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A thermoelectric material is used for manufacturing a thermoelectric element and the thermoelectric material includes: a thermoelectric semiconductor; and a nanosheet having a layered structure and a thickness of about 0.1 to about 10 nanometers (nm).

Performance of the thermoelectric material is evaluated using a ZT value represented by Equation 1 below, which is commonly called as dimensionless figure of merit.

$$ZT = (S^2 \sigma T)/k \qquad \text{Equation 1}$$

In Equation 1, Z denotes a figure of merit, S denotes a Seebeck coefficient, σ denotes electrical conductivity, T denotes an absolute temperature, and k denotes thermal conductivity.

As shown in Equation 1, in order to increase a ZT value of a thermoelectric material, the Seebeck coefficient and electric conductivity, i.e., a power factor ($S^2\sigma$), should be increased and/or thermal conductivity should be decreased. However, in Formula 1 the Seebeck coefficient and the electrical conductivity have a trade-off relationship in which one value increases when the other value decreases according to a change in a concentration of electrons or holes of a carrier. The trade-off relationship suggests that increasing the power factor by changing the Seebeck coefficient or the electrical conductivity is difficult.

Using nano technology, it is possible to prepare a superlattice thin film, a nanowire, or a quantum dot, and by using such a material, a very high thermoelectric performance can be provided by increasing a Seebeck coefficient using a quantum confinement effect or decreasing the thermal conductivity using a phonon glass electron crystal (PGEC) structure.

While not wanting to be bound by theory, it is understood that the quantum confinement effect can be used to increase a Seebeck coefficient without significantly changing electrical conductivity by increasing the density of a states of a carrier in an element to increase the carrier's effective mass, thus breaking the trade-off relationship between the electrical conductivity and the Seebeck coefficient. The PGEC structure selectively reduces thermal conductivity by blocking a phonon (which transfers heat) from moving while not interfering with the movement of a carrier. However, most high efficiency nanostructured materials developed so far have a thin film shape and are difficult to commercialize because it is difficult to provide a bulk material.

Disclosed is a thermoelectric material which includes the thermoelectric semiconductor and the nanosheet having a layered structure and has a thickness of several nanometers, thereby providing a carrier filtering effect provided by a nanoscale layered structure and a PGEC structure for reducing lattice thermal conductivity in a bulk material, e.g., a monolithic or lump material as opposed to a thin film. For example, the thickness of the nanosheet may be less than or equal to about 10 nm. In detail, the thickness may be about 0.1 to about 10 nm, and in more detail, about 0.5 to about 5 nm. Also, the nanosheet may have an aspect ratio of about 1 to about 10,000, specifically about 10 to about 1,000, more specifically about 20 to about 100, wherein the aspect ratio is a ratio of the diameter to the thickness of the nanosheet.

Figure 2:
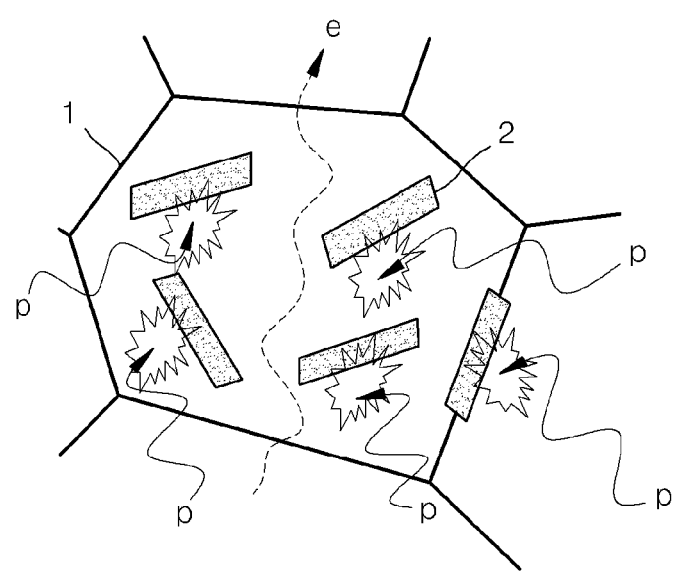
FIG. 2 is a schematic diagram of an embodiment of a thermoelectric material including a nanosheet.

FIG. 1 is a schematic diagram of an embodiment of a method of preparing a thermoelectric element having a bulk shape obtained by pressing and sintering a thermoelectric nanocomposite which includes a thermoelectric semiconductor 1 and a nanosheet 2. Also, FIG. 2 is a schematic diagram of the thermoelectric nanocomposite material including a nanosheet 2 disposed in the thermoelectric semiconductor 1.

Referring to FIG. 1, the thermoelectric semiconductor forms a matrix of the thermoelectric element, and the nanosheet may be introduced into the matrix which provides a bulk structure. In the thermoelectric element, the nanosheet may be partially vitrified and may be dispersed by being wetted or coated on a grain boundary of particles of the thermoelectric semiconductor. As shown in FIG. 2, the nanosheet, disposed on the grain boundary of the thermoelectric semiconductor and/or in the crystallites of the thermoelectric semiconductor, may filter a carrier having a selected energy, e.g., a phonon p, by interrupting movement of the phonon p, decreasing an effective carrier density in the thermoelectric element, and increasing a carrier relaxation time, thereby improving a Seebeck coefficient and decreasing a thermal conductivity of the thermoelectric element. Accordingly, a ZT value, i.e., performance of the thermoelectric element, may be increased.

According to an embodiment, the thickness of the nanosheet may be less than or equal to 10 nm. For example, the thickness of the nanosheet may be about 0.1 to about 10 nm, and more specifically, from about 0.5 to about 5 nm. Also, an average area of the nanosheet may be about 0.0001 to about 100 μm$^2$, specifically about 0.001 to about 10 μm$^2$, more specifically about 0.01 to about 1 μm$^2$.

The nanosheet may effectively suppress 3-dimensional (3D) phonon conduction, and may increase a ZT value, which is a figure of merit of the thermoelectric material, by increasing a power factor ($S^2\sigma$) of the thermoelectric element or decreasing the lattice thermal conductivity of the thermoelectric element by scattering phonons.

Figure 3:
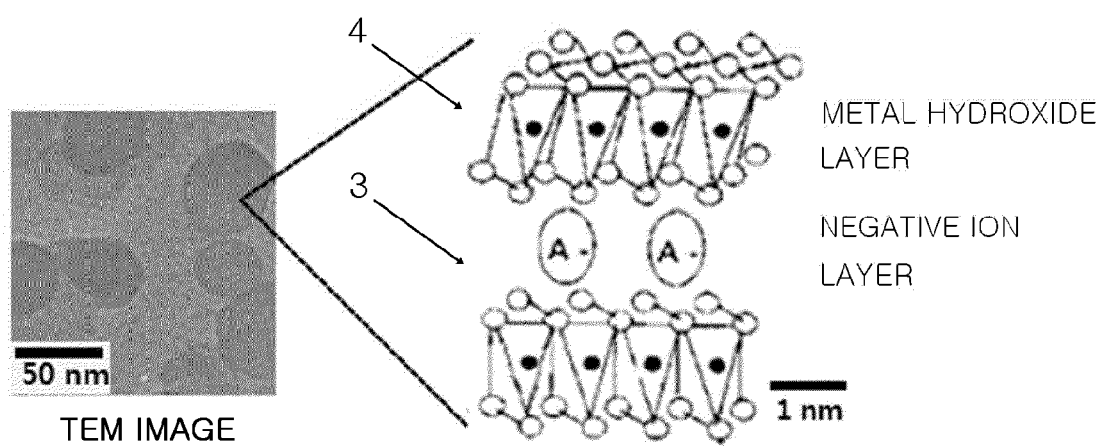
FIG. 3 is a transmission electron microscope (TEM) photographic image and a schematic diagram of a structure of an embodiment of a layered double hydroxide (LDH)

The nanosheet may be obtained from a material that is able to provide a particle having a nanometer scale sheet shape via exfoliation or separation. For example, the nanosheet may be obtained from a material having a layered structure, such as a layered hydroxide-containing material or an intercalation compound. The nanosheet includes a sheet including at least one layer, wherein the sheet is obtained from the material having the layered structure via exfoliation or separation. According to an embodiment, the nanosheet may include a layered material including a metal hydroxide. For example, the nanosheet may have a nanometer scale sheet shape obtained from a layered double hydroxide (LDH). FIG. 3 illustrates a transmission electron microscope (TEM) photographic image and a schematic structure of an embodiment of an LDH. As shown in FIG. 3, the LDH is electrically neutral and has anions 3 (negative ions) inserted between metal hydroxide layers 4, e.g., brucite type metal hydroxide layers, having a positive charge. The LDH having such a structure is different from a solid state material in which positive ions are inserted between layers having a negative charge.

According to an embodiment, the nanosheet may include an LDH represented by Formula 1 below:

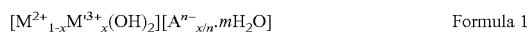

$$[M^{2+}_{1-x}M'^{3+}_{x}(OH)_2][A^{n-}_{x/n} \cdot mH_2O] \qquad \text{Formula 1}$$

In Formula 1, $M^{2+}$ denotes a divalent metal ion, $M'^{3+}$ denotes a trivalent metal ion, $A^{n-}$ denotes an anion, e.g., an inorganic anion, having a valence of n, $0.2 \leq x \leq 0.33$, n is an integer from 1 to 3, and $0.5 \leq m \leq 4$.

According to an embodiment, $M^{2+}$ may be selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof, $M'^{3+}$ may be selected from $Al^{3+}$, $Cr^{3+}$, $Mn^{3+}$, $Fe^{3+}$, $Co^{3+}$, $Ni^{3+}$, $La^{3+}$, and a combination thereof, and $A^{n-}$ may be selected from $CO_3^{2-}$, $OH^-$, $NO_3^-$, $SO_4^{2-}$, $ClO_4^-$, $WO_4^{2-}$, and a combination thereof.

The nanosheet may be obtained by exfoliating a layered compound to provide a particle having a sheet shape having a thickness of several nanometers using an exfoliation method or separation method, the details of which can be determined by one of skill in the art without undue experimentation. For example, the nanosheet may be prepared by exfoliating a layered compound prepared by performing a hydrothermal method, a reconstruction method, or co-precipitation method on a metal salt (such as a metal nitrate). Representative preparation methods are disclosed in Iyi, N.; Matsumoto, T.; Kaneko, Y.; Kitamura, K. *Chem. Lett.* 2004, 33, 1122; and Iyi, N.; Matsumoto, T.; Kaneko, Y.; Kitamura, K. *Chem. Mater.* 2004, 16, 2926, the contents of which in their entirety are herein incorporated by reference. A layered compound prepared by performing a co-precipitation method or a hydrothermal method on a metal salt (e.g., a nitrate) may be separated or exfoliated to provide a nanosheet by dispersing the layered compound in a suitable solvent. The nanosheet may be mechanically and/or chemically mixed with a thermoelectric semiconductor and then treated in a partial reduction thermal-treatment or a post-process which includes co-melting and/or quenching before being used to provide the thermoelectric element.

The thermoelectric semiconductor included in the thermoelectric material is not limited as long as it provides suitable thermoelectric properties, and for example may include an element selected from a transition metal, a rare earth element, a Group 13 element, a Group 14 element, a Group 15 element, and a Group 16 element, and a combination thereof. As used herein, a transition metal is an element of Groups 3 to 12. As used herein, a rare earth element includes the fifteen lanthanide elements, i.e., those elements having atomic numbers 57 to 71, plus scandium and yttrium. The rare earth element may be selected from Y, Ce, and La, and a combination thereof; the transition metal may be selected from Ti, Zr, Hf, V, Nb, Ta, Cr, Mo, W, Mn, Fe, Co, Ni, Cu, Zn, Ag, and Re, and a combination thereof; the Group 13 element may be selected from B, Al, Ga, and In, and a combination thereof; the Group 14 element may be selected from C, Si, Ge, Sn, and Pb, and a combination thereof; the Group 15 element may be selected from P, As, Sb, and Bi, and a combination thereof; and the Group 16 element may be selected from S, Se, and Te, and a combination thereof. In an embodiment, any combination of the foregoing may be used. For example, the thermoelectric semiconductor may include at least two of the foregoing elements. In an embodiment, the thermoelectric material includes a combination of thermoelectric semiconductors.

Examples of the thermoelectric semiconductor include a Bi—Te-containing, a Co—Sb-containing, a Pb—Te-containing, a Ge—Tb-containing, a Si—Ge-containing, a Sb—Te-containing, a Sm—Co-containing, and a transition metal silicide-containing thermoelectric semiconductor. Electrical characteristics of the thermoelectric semiconductor may be improved by including an element selected from the transition metal, the rare earth element, the Group 13 element, the Group 14 element, the Group 15 element, and the Group 16 element as a dopant.

The Bi—Te-containing thermoelectric semiconductor may be a $(Bi,Sb)_2(Te,Se)_3$-containing thermoelectric semiconductor including Sb and Se as a dopant, the Co—Sb-containing thermoelectric semiconductor may be a $CoSb_3$-containing thermoelectric semiconductor, the Sb—Te-containing thermoelectric semiconductor may be $AgSbTe_2$ or $CuSbTe_2$, and the Pb—Te-containing thermoelectric semiconductor may be PbTe or $(PbTe)_m AgSbTe_2$.

The thermoelectric semiconductor may be in the form of particles having a selected size, and for example, an average particle diameter (e.g., an average largest particle diameter) may be about 0.01 to about 100 μm, specifically about 0.1 to about 80 μm, more specifically about 1 to about 40 μm.

The thermoelectric semiconductor may be prepared by any of various methods, and the method is not specifically limited. The various methods include the following.

1. A method using an ampoule in which a raw material is disposed in a quartz tube or metal ampoule, the quartz tube or metal ampoule sealed, and then thermal-treating the sealed quartz tube or metal ampoule in vacuum.

2. An arc melting method in which a raw material is disposed in a chamber and melted by arc discharging under an inert gas atmosphere.

3. A solid state reaction method which includes thermally-treating a powder after mixing and hardening the powder, or sintering a mixed powder after thermal-treating the mixed powder.

4. A metal flux method in which a raw material and an element for providing an atmosphere suitable for growing a crystal of the raw material at a high temperature is disposed into a crucible, and thermal-treating the raw material and the element at a high temperature to grow a crystal.

5. A Bridgeman method in which a raw material is disposed into a crucible, heating an end of the crucible at a high temperature until the raw material melts, and then growing a crystal by locally melting a portion of the raw material by slowly moving the high temperature region, and passing the entire sample of the raw material through the high temperature region.

6. A zone melting method in which a raw material is provided in the form of a seed rod and a feed rod, and growing a crystal by locally heating the seed rod and the feed rod at a high temperature to melt a portion while slowly moving a melted portion upward.

7. A vapour transport method in which a raw material is disposed at an end of a quartz tube and heating the end of the quartz tube where the raw material is present while having an opposite end of the quartz tube at a lower temperature so that a crystal is grown as the raw material is vaporized and crystallizes at the lower temperature portion of the quartz tube.

8. A mechanical alloying method comprising rotating a raw material powder and a steel ball in a jar formed of sintered carbide, and alloying the raw material powder and the steel ball as the steel ball mechanically impacts the raw material powder.

The thermoelectric semiconductor may be prepared according to any of the above methods, and may be processed (e.g., sorted) by a mechanical sieve method to sort particles of the thermoelectric semiconductor to provide a selected average diameter.

The thermoelectric material including the thermoelectric semiconductor and the nanosheet may be prepared using any of a dry and a wet mixing method for mixing powders. Specifically, examples of the dry mixing method include a ball milling method, an attrition milling method, a planetary milling method, a jet milling method, and a high energy milling method. Alternatively, the thermoelectric material may be prepared by co-melting the nanosheet and particles of the thermoelectric semiconductor and then quenching the combination.

According to another embodiment, a thermoelectric material may include a thermoelectric semiconductor and a metal hydroxide having a layered structure.

The metal hydroxide having the layered structure is a material having a nano-scale sheet shape including at least one layer. According to an embodiment, the metal hydroxide may be a layered double hydroxide (LDH) represented by Formula 1 below:

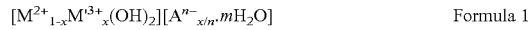

$[M^{2+}_{1-x}M'^{3+}_{x}(OH)_2][A^{n-}_{x/n} \cdot mH_2O]$    Formula 1

In Formula 1, $M^{2+}$ denotes a divalent metal ion, $M'^{3+}$ denotes a trivalent metal ion, $A^{n-}$ denotes an anion, e.g., an inorganic anion, having a valence of n, $0.2 \leq x \leq 0.33$, n is an integer from 1 to 3, and $0.5 \leq m \leq 4$.

$M^{2+}$ may be selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof, $M'^{3+}$ may be selected from $Al^{3+}$, $Cr^{3+}$, $Mn^{3+}$, $Fe^{3+}$, $Co^{3+}$, $Ni^{3+}$, $La^{3+}$, and a combination thereof, and $A^{n-}$ may be selected from $CO_3^{2-}$, $OH^-$, $NO_3^-$, $SO_4^{2-}$, $ClO_4^-$, $WO_4^{2-}$, and a combination thereof.

The metal hydroxide, such as the LDH, has a layered structure in which anions are inserted between metal hydroxide layers having a positive charge, and may have a nanosheet shape including at least one layer. Accordingly, the metal hydroxide may effectively suppress phonon conduction and may increase a ZT value, which is a figure of merit of a thermoelectric material, by increasing a power factor ($S^2\sigma$) of the thermoelectric material or decreasing the lattice thermal conductivity of the thermoelectric element by scattering phonons.

Since the metal hydroxide having the layered structure is as described above, details thereof will not be repeated herein.

A distance between layers in the metal hydroxide having the layered structure may be measured by X-ray diffraction analysis, and may be about 1 to 40 angstroms (Å), specifically about 4 to about 30 Å, more specifically about 7 to about 20 Å.

A thickness of a nanosheet of the metal hydroxide may be about 0.1 to about 50 nm. More specifically, the thickness may be about 0.1 to about 20 nm, and more specifically, about 0.1 to about 10 nm. Also, the nanosheet of the metal hydroxide may have an aspect ratio of about 1 to about 10,000, specifically about 10 to about 1,000, more specifically about 20 to about 100, wherein the aspect ratio is a ratio of the diameter to the thickness of the nanosheet.

The thermoelectric element may be prepared by mechanically or chemically mixing the particles of the thermoelectric semiconductor and the nanosheet, thermal-treating to partially reduce the resulting mixture or performing a post-process such as melting and quenching on the resulting mixture, and then pressing and sintering the resulting mixture. The nanosheet may be partially vitrified via the pressing and sintering processes may be distributed on a grain boundary of the particles of the thermoelectric semiconductor, which is a matrix, to provide the thermoelectric element having a bulk shape. Alternatively or additionally, the nanosheet may be included in the crystallites of the thermoelectric semiconductor.

According to another embodiment, a thermoelectric element including the thermoelectric material is provided.

The thermoelectric material may be provided in bulk form and having a suitable shape to provide a thermoelectric element for a device. The thermoelectric element may have any suitable shape, for example, a rectangular parallelepiped shape, and may be shaped via a cutting process so that it has a shape suitable for use in a thermoelectric module. The thermoelectric element may be a p-type or n-type thermoelectric element. The thermoelectric element may be contacted with an electrode to provide a cooling effect when electrical current is applied or a power generating effect from a temperature difference across the thermoelectric element.

According to another embodiment, provided is a method of preparing a thermoelectric element, the method including: preparing a mixture including particles of a thermoelectric semiconductor and a nanosheet having a layered structure; and sintering the mixture under pressure.

A thickness of the nanosheet may be about 0.1 to about 10 nm.

Since the particles of the thermoelectric semiconductor and the nanosheet have been described above, details thereof will not be repeated herein. The mixture may be prepared via a general mixing method, and is not specifically limited. According to an embodiment, the particles of the thermoelectric semiconductor and the nanosheet may be mechanically or chemically mixed, and then thermally-treated to partially reduce the mixture, or co-melted, and quenched to prepare the thermoelectric material.

The mixture may be sintered under pressure so as to obtain the thermoelectric element having a bulk shape.

According to an embodiment, the sintering may be performed by using a general hot pressing method, or a spark plasma sintering (SPS) method. The sintering may be more quickly performed at a relatively low temperature in the SPS method as compared to a general sintering method, and thus characteristics of an initial raw material may be preserved since initial structures of the particles of the thermoelectric semiconductor and the nanosheet are not exposed to a high temperature for a long time during the sintering.

According to an embodiment, the sintering may be performed under a pressure of about 1 to about 100 MPa, specifically about 5 to about 50 MPa, more specifically about 10 to about 10 MPa at a temperature from about 300 to about 500° C., specifically 350 to about 450° C.

While not wanting to be bound by theory, it is understood that in an embodiment the particles of the thermoelectric semiconductor form a matrix via the pressurizing and sintering processes, and the nanosheet is disposed on the grain boundaries between crystal grains of the thermoelectric semiconductor while being partially vitrified. For example, when an LDH is used as the nanosheet, an anionic group, such as a carbonate group, which is inserted between layers of the LDH is removed, and the nanosheet including the metal hydroxide is dispersed by being wetted or coated on the grain boundaries of the crystal grains of the thermoelectric material. Alternatively, the nanosheet may be disposed in the crystal grains of the thermoelectric semiconductor.

By introducing the nanosheet to provide the thermoelectric element via the foregoing method, for example, a PGEC structure may be provided and a carrier filtering effect may be generated as the introduced nanosheet changes an electron density of states. Further, the nanosheet may increase phonon scattering, and thus the thermoelectric element having reduced thermal conductivity may be prepared.

According to another embodiment, a thermoelectric module including: a first electrode; a second electrode facing the first electrode; and the thermoelectric element disposed between the first and second electrodes is provided.

Figure 4:
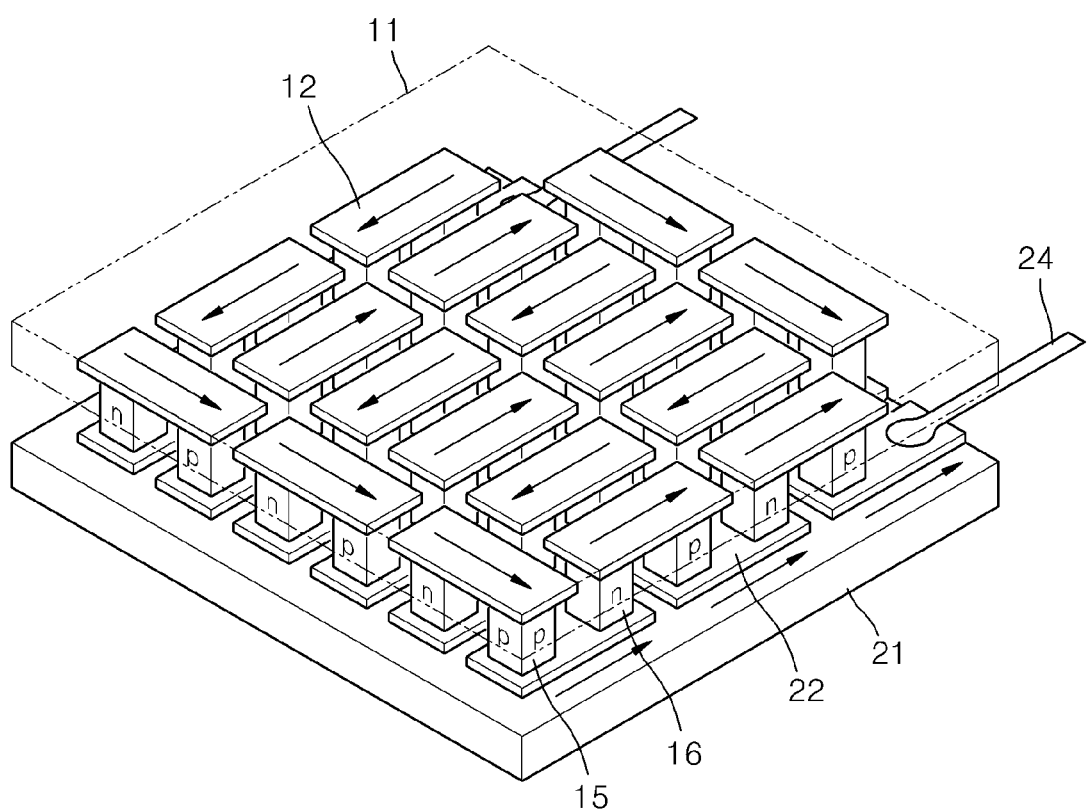
FIG. 4 is a perspective view of an embodiment of a thermoelectric module.

FIG. 4 is a diagram of an embodiment of a thermoelectric module comprising the thermoelectric element. As shown in FIG. 4, an upper electrode 12 and a lower electrode 22 are patterned respectively on an upper insulating substrate 11 and a lower insulating substrate 21, and a p-type thermoelectric element 15 and an n-type thermoelectric element 16 both contact the upper electrode 12 and the lower electrode 22. The upper and lower electrodes 22 are connected to the outside of the thermoelectric module via a lead electrode 24.

The upper and lower insulating substrates 11 and 21 may comprise a material selected from gallium arsenide (GaAs), sapphire, silicon, a glass such as pyrex, and quartz, and a combination thereof, for example. Also, the upper and lower electrodes 12 and 22 may comprise a metal such as a metal selected from aluminium, nickel, gold, and titanium, and a combination thereof, and may have any suitable size. The upper and lower electrodes 12 and 22 may be patterned using a suitable patterning method, such as a lift-off semiconductor process, a deposition method, or a photolithography method.

Figure 5:
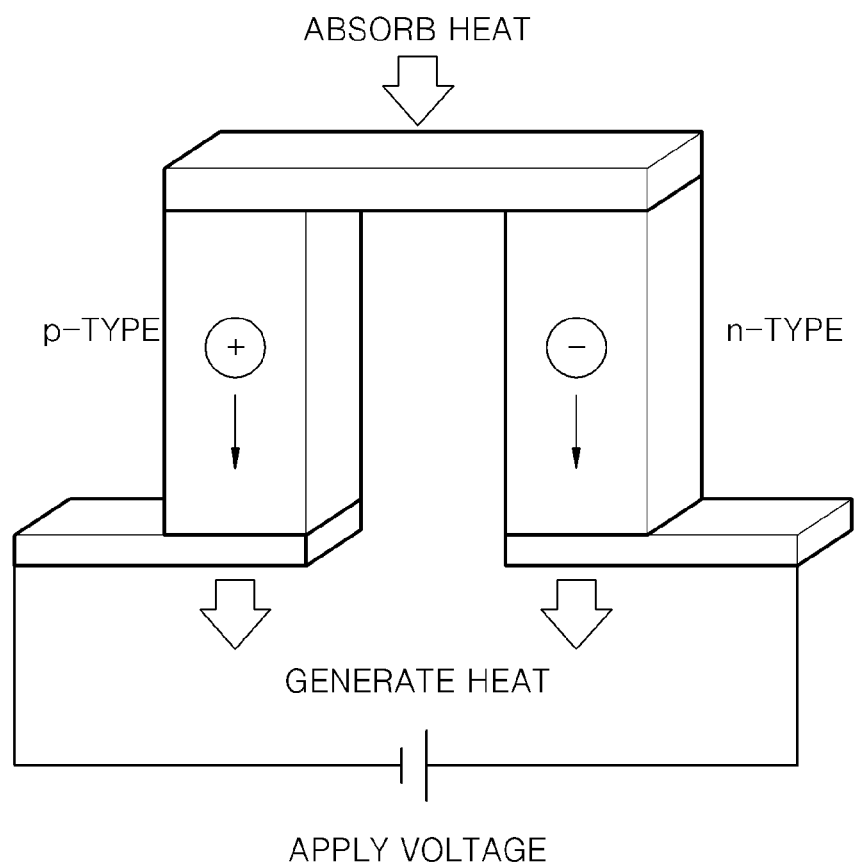
FIG. 5 is a schematic diagram of an embodiment of a thermoelectric module, which shows thermoelectric cooling according to a Peltier effect.
Figure 6:
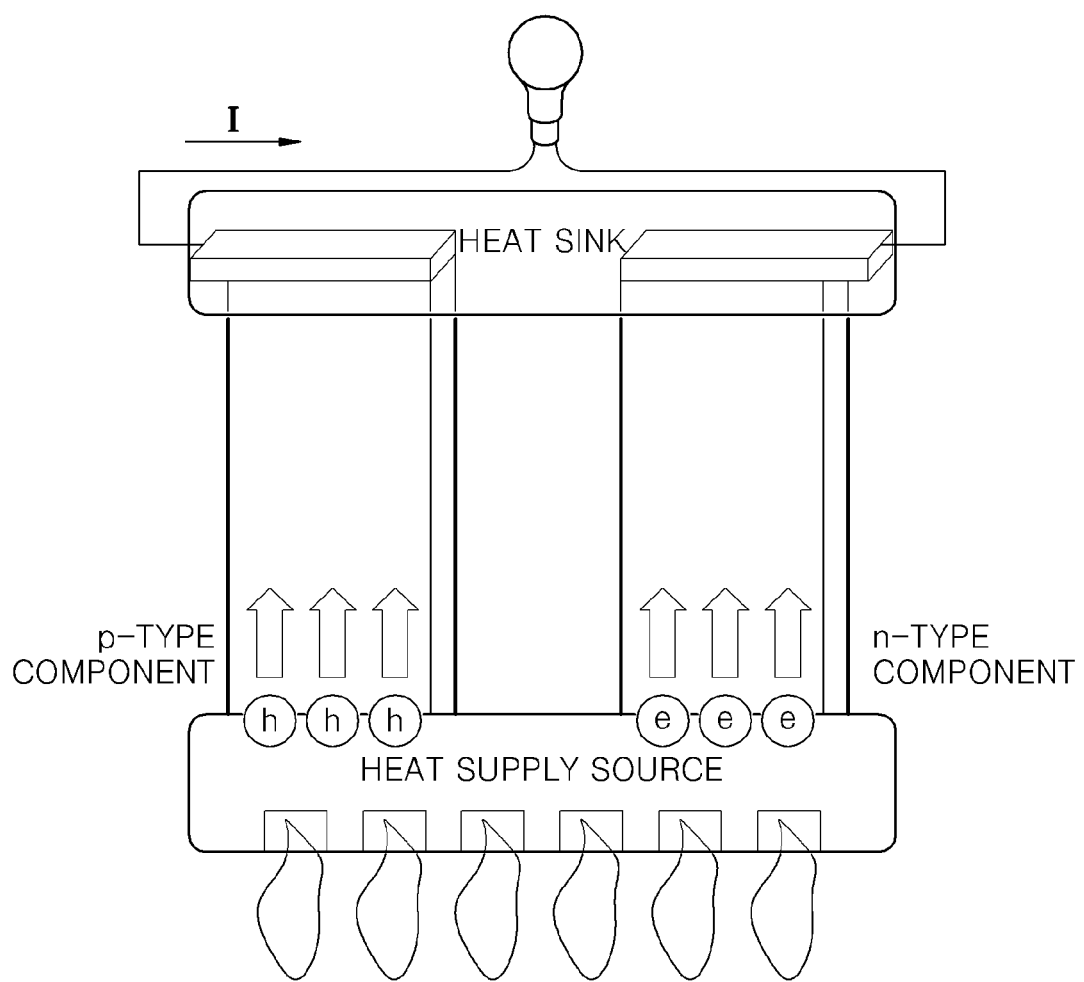
FIG. 6 is a schematic diagram of an embodiment of a thermoelectric module, which shows thermoelectric power generation according to a Seebeck effect.

Alternatively, a thermoelectric module may include a first electrode, a second electrode, and the thermoelectric element disposed between the first and second electrodes, as shown in FIGS. 5 and 6. The thermoelectric modules of FIGS. 5 and 6 may further include an insulating substrate on which at least one of the first and second electrodes is disposed. The insulating substrate may be one of the upper and lower insulating substrates 11 and 21 as shown in FIG. 4.

As shown in FIG. 5, the first and second electrodes may be electrically connected to a power supply. When an external direct current (DC) voltage is applied, holes of the p-type thermoelectric element and electrons of the n-type thermoelectric element move, and thus heat may be generated and absorbed at ends of the thermoelectric elements.

As shown in FIG. 6, at least one of the first and second electrodes may be exposed to a heat supply source. When heat is received from the heat supply source, electrons and holes move to generate power as a current flows in the thermoelectric element.

In a thermoelectric module according to an embodiment, a p-type thermoelectric element and an n-type thermoelectric element may be alternately arranged, wherein at least one of the p-type thermoelectric element and an n-type thermoelectric element includes the thermoelectric material comprising the nanosheet.

According to an embodiment, there is provided a thermoelectric device including a heat supply source and the thermoelectric module, wherein the thermoelectric module absorbs heat from the heat supply source and includes the thermoelectric module, a first electrode, and a second electrode, wherein the first and second electrodes face each other. One of the first and second electrodes may contact the thermoelectric material.

The thermoelectric device according to an embodiment may further include a power supply source electrically connected to the first and second electrodes. The thermoelectric device according to an embodiment may further include an electrical device electrically connected to one of the first and second electrodes.

The thermoelectric material, the thermoelectric element, the thermoelectric module, and the thermoelectric device may be used in a thermoelectric cooling system or a thermoelectric power generating system. Examples of the thermoelectric cooling system include a micro cooling system, a general-purpose cooling device, an air conditioner, and a cogeneration system, but are not limited thereto. A structure and manufacturing method of the thermoelectric cooling system may be determined by one of ordinary skill in the art without undue experimentation, and thus details thereof will be omitted.

The present disclosure will be described in greater detail with reference to the following examples. The following examples are for illustrative purposes only and are not intended to limit the scope of the invention.

Example 1

Preparation of Thermoelectric Material with P-Type $Bi_{0.5}Sb_{1.5}Te_3$

A Bi—Te-containing alloy was prepared to be used as particles of a thermoelectric semiconductor. In order to prepare the Bi—Te-containing alloy, Bi, Sb, and Te, which are raw materials, were weighed at a molar ratio of 0.5:1.5:3 and put together with a steel ball into a jar formed of sintered carbide, and the jar was rotated to prepare p-type $Bi_{0.5}Sb_{1.5}Te_3$ powder. The $Bi_{0.5}Sb_{1.5}Te_3$ powder was sorted to provide a powder having a size less than or equal to several tens of μm by using a mechanical sieve (325 mesh) to obtain initial powder.

Nanosheet powder was obtained by exfoliating Mg—Al LDH (formula: $[Mg_{0.65}Al_{0.33}(OH)_2][(CO_3)_{0.17}\cdot 0.5H_2O]$) in formamide, and washing and thermal-treating the resultant in the air. For uniform exfoliation, 0.05 grams (g) of LDH powder was put into and sealed in 100 cubic centimeters (cc) of formamide and was stirred for 24 hours at a speed of 170 revolutions per minute (rpm) while continuously pursing nitrogen. The formamide solution in which the exfoliated nanosheet is dispersed was washed with 100 cc of ethanol four times and thermal-treated at 300° C. to obtain a dried nanosheet powder. FIG. 3 shows the TEM photographic image of the nanosheet powder, and a thickness of the nanosheet was less than or equal to several nm.

The nanosheet powder was added to three 10 g samples of the $Bi_{0.5}Sb_{1.5}Te_3$ powder such that the amounts of nanosheet were 0.5 wt %, 0.25 wt %, and 0.1 wt %, respectively, and each of the three samples was mixed for 10 minutes using a high energy ball mill. In order to prevent oxidation of the thermoelectric material due to heat generated during ball milling, nitrogen was injected into the high energy ball mill. Mixed powders obtained as such were put into an alumina crucible and thermally-treated for 3 hours by increasing a temperature to 300° C. under a nitrogen and hydrogen mixture ($N_2$ 95 volume % and $H_2$ 5 volume %), thereby obtaining three samples of the thermoelectric material in which the amounts of the nanosheet were respectively 0.5 wt %, 0.25 wt %, and 0.1 wt %.

Example 2

Preparation of Thermoelectric Material with P-Type $Bi_{0.5}Sb_{1.5}Te_3$

Thermoelectric materials in which the amounts of the nanosheet were respectively 0.5 wt %, 0.25 wt %, and 0.1 wt % were prepared in the same manner as in Example 1, except that instead of the nanosheet powder of Example 1, 1 g of Mg—Al LDH powder dispersed in 20 cc of formamide, and ultrasonic treatment and gelation at 50° C. was used.

Example 3

Preparation of Thermoelectric Material with P-Type $Bi_{0.5}Sb_{1.5}Te_3$

Thermoelectric materials in which the amounts of nanosheet were respectively 0.5 wt %, 0.25 wt %, and 0.1 wt % were prepared by preparing the $Bi_{0.5}Sb_{1.5}Te_3$ powder and the nanosheet powder as in Example 1, adding the nanosheet powder to 10 g of the $Bi_{0.5}Sb_{1.5}Te_3$ powder such that the amounts of the nanosheet were 0.5 wt %, 0.25 wt %, and 0.1 wt %, and then melting, quenching, and pulverizing the resulting product, wherein the pulverizing was performed for 30 minutes using a high energy ball mill.

Example 4

Preparation of Thermoelectric Material with N-Type $Bi_2Te_{2.4}Se_{0.6}$

In order to prepare an n-type Bi—Te-containing alloy, Bi, Te, and Se, which are raw materials, were weighed at a molar ratio of 2:2.4:0.6 and put together with a steel ball into a jar formed of sintered carbide, and the jar was rotated to prepare n-type $Bi_2Te_{2.4}Se_{0.6}$ powder. The gelled nanosheet used in Example 2 was used in Example 4, and thermoelectric materials in which the amounts of nanosheet were respectively 0.1 wt %, 0.25 wt %, and 10 wt % were prepared by performing the same mixing processes as in Examples 1 through 3.

Example 5

Preparation of Thermoelectric Material—LDH Type

Four types of LDH were prepared to evaluate the effects of adding nanosheets derived from various types of LDH, aside from the Mg—Al LDH used in Examples 1 through 4. Nanosheets were synthesized by exfoliating Zn—Al LDH (formula: $Zn_{3.6}Al_2(OH)_{11.2}[O_2CC_6H_4CO_2].5.5H_2O$), Ca—Fe LDH (formula: $Ca_2Fe(OH)_6(NO_3).1.3H_2O$), Zn—Fe LDH (formula: $Zn_2Fe(OH)_6(SO_4)_{0.5}.H_2O$), and Zn—Cr LDH (formula: $Zn_2Cr(OH)_6Cl_{0.7}(CO_3)_{0.15}.2.1H_2O$), aside from the Mg—Al LDH, using the same method described in Example 1. Here, exfoliation/dispersibility was increased by adding a formamide solution in which a nanosheet in predetermined amount (~0.5 wt %) is dispersed in a ethyl acetate (EtAc) and the formamide solution treated with ultrasonic waves. A predetermined amount of the Bi—Te-containing powder used in Example 1 was added to the nanosheet/formamide/EtAc mixed solution, then the resulting products were dried, and reduction thermally-treated as in Example 1 to prepare thermoelectric materials.

Thermoelectric performance was evaluated by adding 0.1 wt %, 0.274 wt %, 0.5 wt %, and 0.585 wt % of Mg—Al LDH to investigate the effects of adding the Mg—Al LDH, and the effects on the performance of thermoelectric nanocomposite were evaluated by fixing the amounts of the remaining Zn—Al LDH, Ca—Fe LDH, Zn—Fe LDH, and Zn—Cr LDH to about 0.5 wt %.

Comparative Examples 1 Through 5

A Bi—Te-containing alloy that does not include a nanosheet was prepared for comparison. In detail, a $Bi_{0.5}Sb_{1.5}Te_3$ alloy was prepared in Comparative Example 1 to be compared with Example 1, a $Bi_{0.5}Sb_{1.5}Te_3$ alloy was prepared in Comparative Example 2 to be compared with Example 2, a $Bi_{0.45}Sb_{1.55}Te_3$ alloy was prepared in Comparative Example 3 to be compared with Example 3, a $Bi_2Te_{2.4}Se_{0.6}$ alloy was prepared in Comparative Example 4 to be compared with Example 4, and a $Bi_{0.4}Sb_{1.6}Te_3$ alloy was prepared in Comparative Example 5 to be compared with Example 5.

Evaluation Example 1

Measurement of Thermoelectric Performance

Seebeck coefficients, electrical conductivities, power factors, thermal conductivities, lattice thermal conductivities, and dimensionless figures of merit of the thermoelectric materials obtained in Examples 1 through 5 were measured. Also, a Bi—Te-containing alloy that does not include a nanosheet was used analysed for comparison purposes.

The thermal conductivities and lattice thermal conductivities were calculated by measuring thermal diffusivity using a laser flash method, the Seebeck coefficients and electrical conductivities were measured by using a 4-terminal method, and the power factors and dimensionless figures of merit were measured by using the measurement values thereof.

Figure 7:
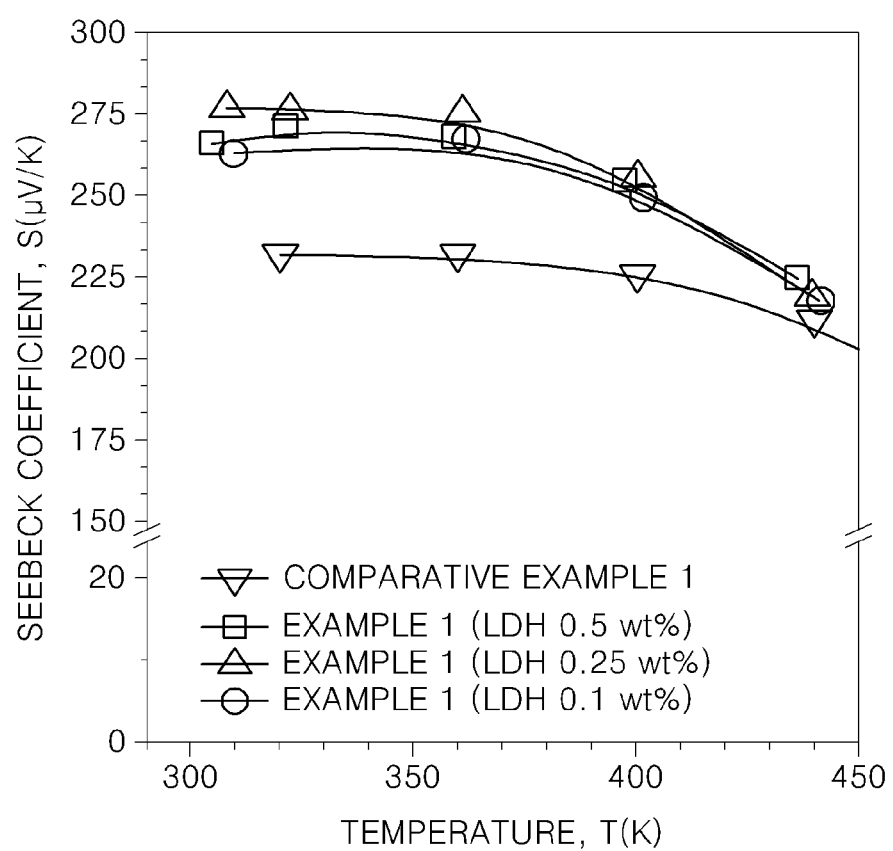
FIG. 7 is a graph of Seebeck coefficient (S, microvolts per Kelvin, $\mu V/K$) versus temperature (Kelvin, K) showing the results of measuring Seebeck coefficients of Example 1 and Comparative Example 1.

FIG. 7 is a graph showing results of measuring Seebeck coefficients of Example 1.

Figure 8A:
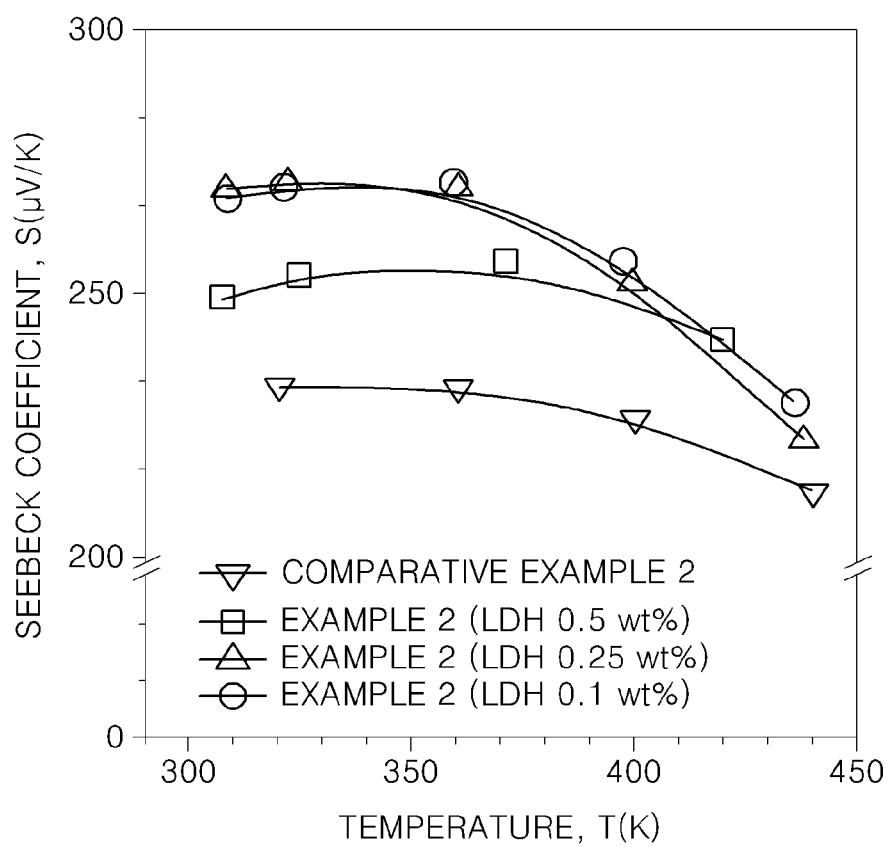
FIGS. 8A through 8C are graphs of Seebeck coefficient (S, microvolts per Kelvin, $\mu V/K$) versus temperature (Kelvin, K), thermal conductivity (Watts per meter-Kelvin, W/mK) versus temperature (Kelvin, K), and Figure of Merit (ZT) versus temperature (Kelvin, K), respectively, showing results of measuring Seebeck coefficients, thermal conductivities, and dimensionless thermoelectric figures of merit of Example 2 and Comparative Example 2.
Figure 8B:
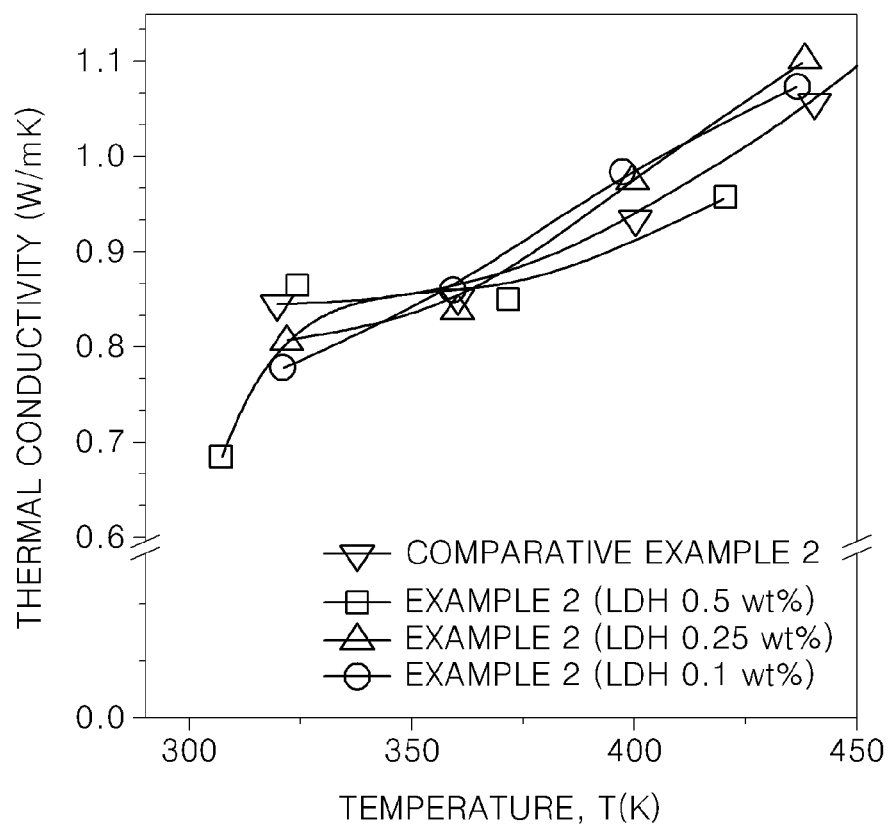
Figure 8C:
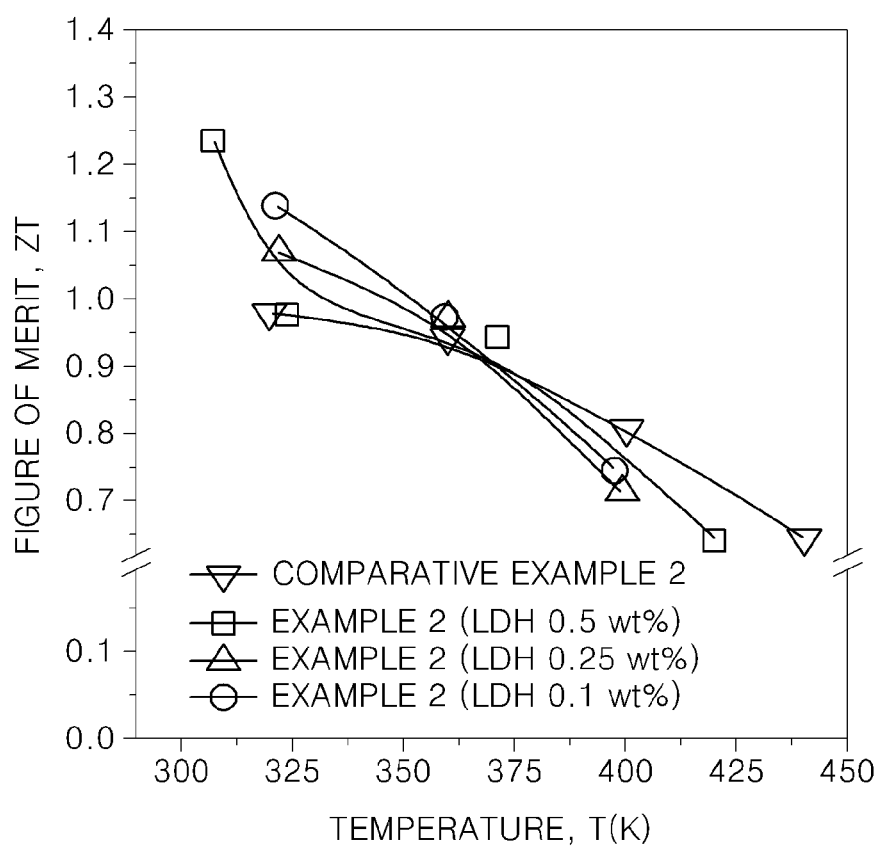

FIGS. 8A through 8C are graphs respectively showing results of measuring Seebeck coefficients, thermal conductivities, and dimensionless thermoelectric figures of merit of Example 2.

FIGS. 9A through 9D are graphs respectively showing results of measuring Seebeck coefficients, power factors, lattice thermal conductivities, and dimensionless thermoelectric figures of merit of Example 3.

FIGS. 10A through 10D are graphs respectively showing results of measuring Seebeck coefficients, power factors, thermal conductivities, and dimensionless thermoelectric figures of merit of Example 4.

Figure 11A:
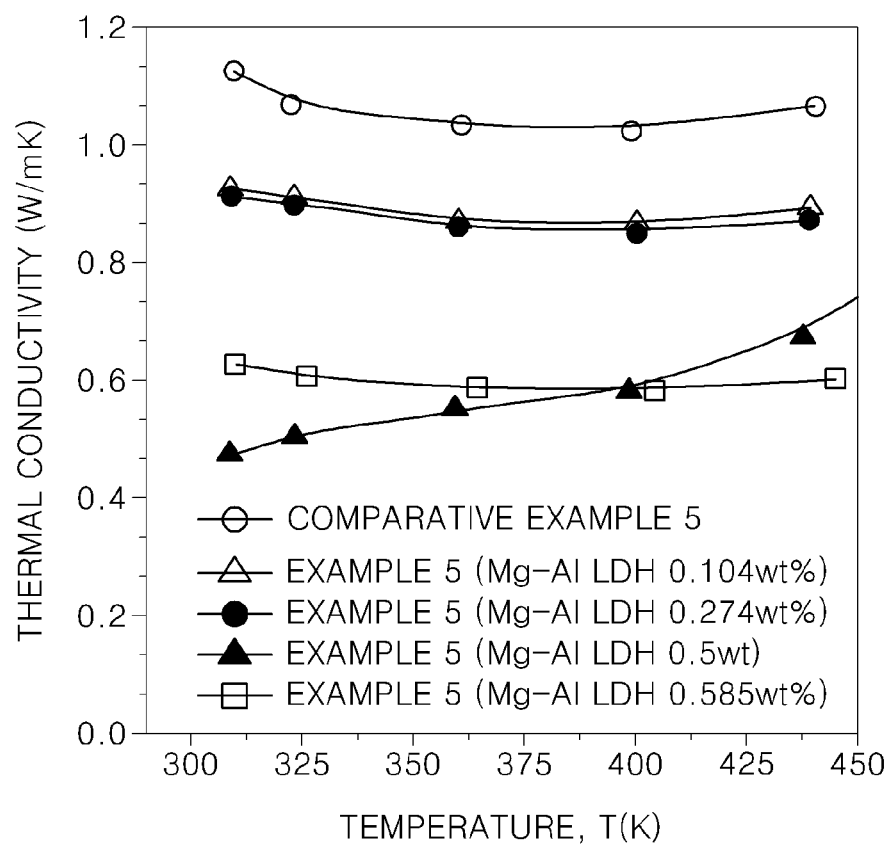
FIGS. 11A and 11B are graphs of thermal conductivity (Watts per meter-Kelvin, W/mK) versus temperature (Kelvin, K) and lattice thermal conductivity (Watts per meter-Kelvin, W/mK) versus temperature (Kelvin, K), respectively, showing results of measuring thermal conductivities and lattice thermal conductivities of thermoelectric nanocomposites according to added amounts of a nanosheet derived from magnesium-aluminum (Mg—Al) LDH in Example 5 and Comparative Example 5.
Figure 11B:
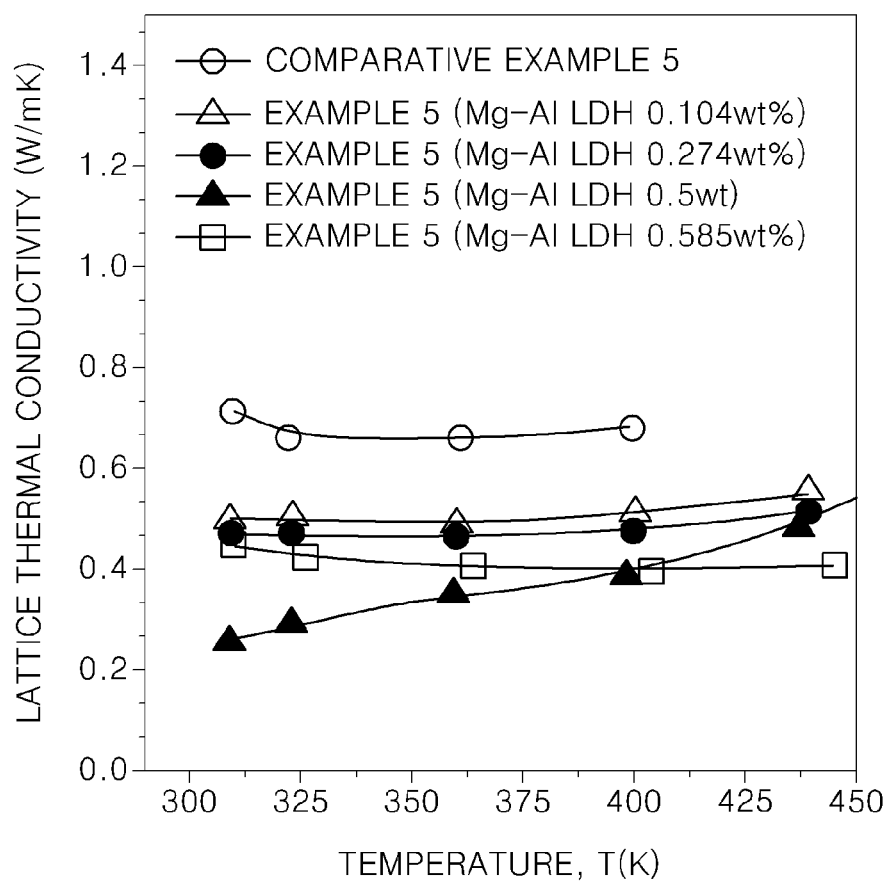
Figure 12A:
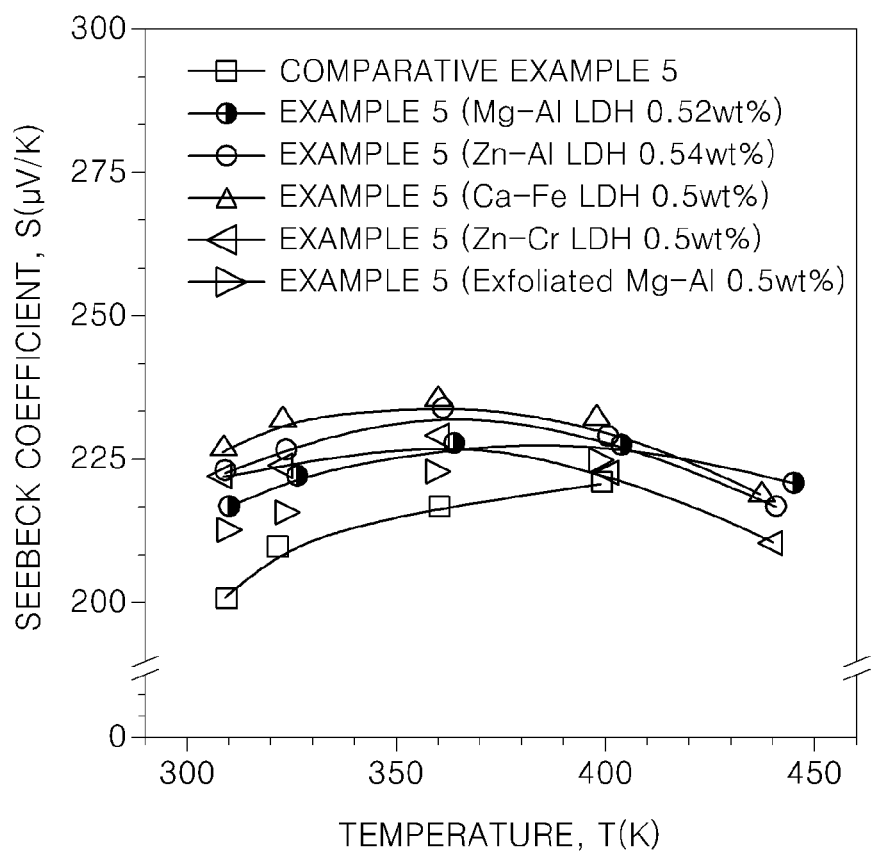
FIGS. 12A and 12B are graphs of Seebeck coefficient (S, microvolts per Kelvin, $\mu V/K$) versus temperature (Kelvin, K) and thermal conductivity (Watts per meter-Kelvin, W/mK) versus temperature (Kelvin, K), respectively, showing results of measuring Seebeck coefficients and thermal conductivities of thermoelectric nanocomposites according to added amounts of a nanosheet derived from selected LDHs aside from Mg—Al LDH in Example 5 and Comparative Example 5.
Figure 12B:
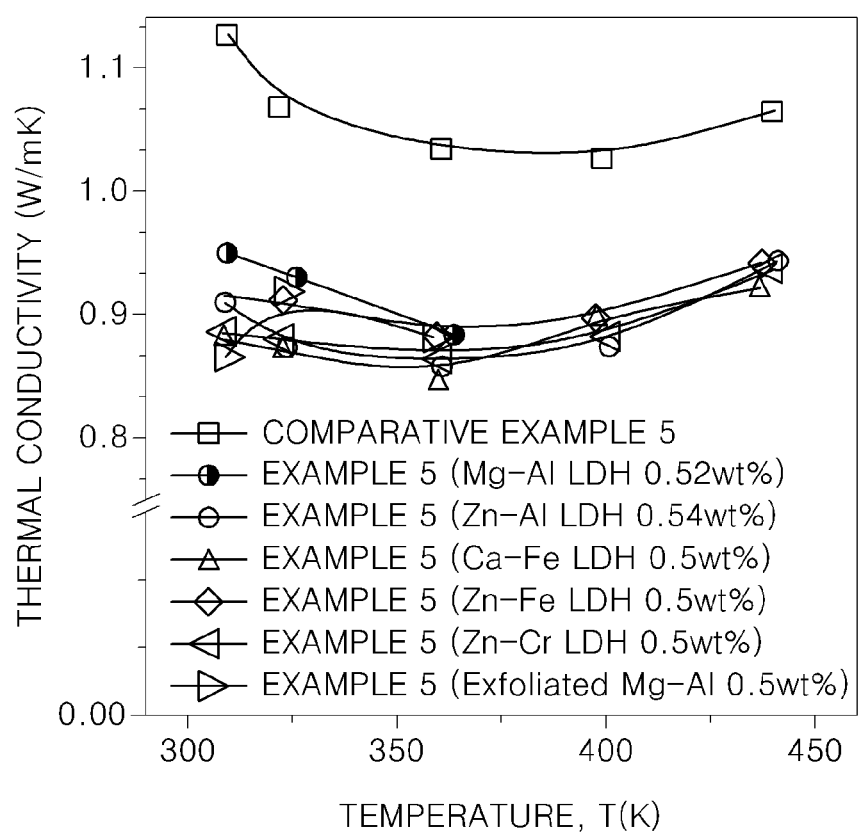

FIGS. 11A and 11B are graphs respectively showing results of measuring thermal conductivities and lattice thermal conductivities of thermoelectric nanocomposites according to added amounts of nanosheet induced from Mg—Al LDH in Example 5, and FIGS. 12A and 12B are graphs respectively showing results of measuring Seebeck coefficients and thermal conductivities of thermoelectric nanocomposites according to addition of nanosheets induced from selected amounts of LDHs aside from Mg—Al LDH in Example 5.

As shown in FIGS. 7 through 12B, in Examples 1 through 5, the Seebeck coefficients are increased while the thermal conductivities are decreased by changing a state of electrons by introducing the nanosheet. As a result, it is determined that the dimensionless thermoelectric figures of merit of the Bi—Te-containing thermoelectric material may be improved by adding the nanosheet derived from the LDH, regardless of whether the material is p-type or n-type.

FIGS. 8A through 8C are graphs respectively showing results of measuring Seebeck coefficients, thermal conductivities, and dimensionless thermoelectric figures of merit of Example 2.

As shown in FIGS. 8A through 8C, the Seebeck coefficients increased as in Example 1, and specifically, the thermal conductivities in a room temperature region were decreased. As a result, the dimensionless thermoelectric figures of merit of Example 2 were improved.

Figure 9A:
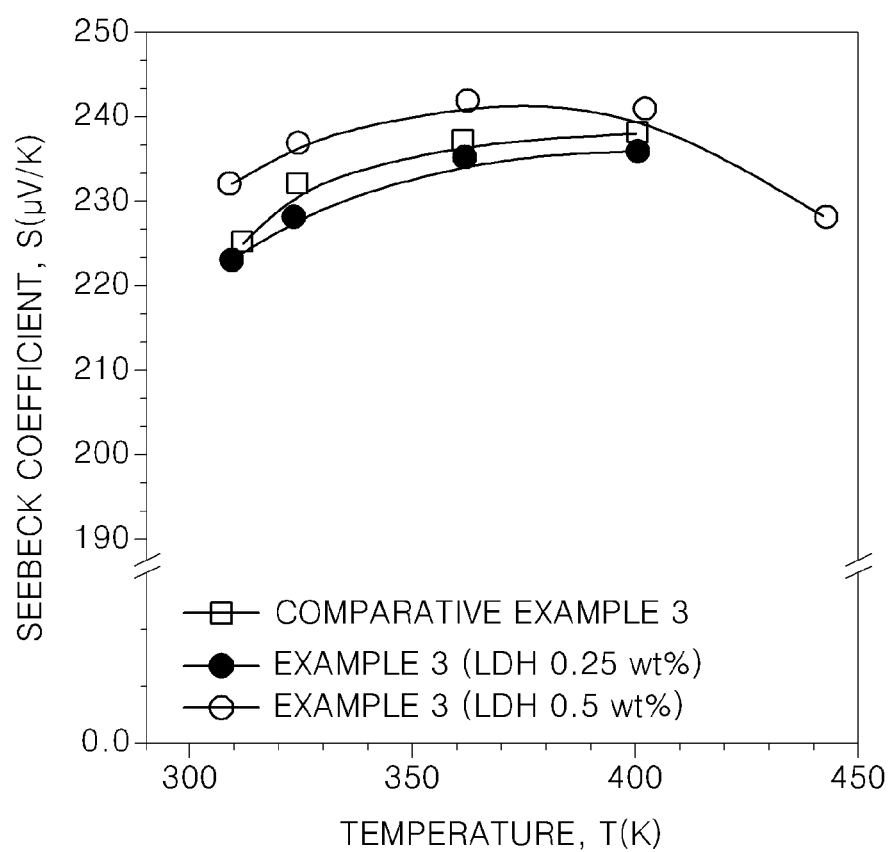
FIGS. 9A through 9D are graphs of Seebeck coefficient (S, microvolts per Kelvin, $\mu V/K$) versus temperature (Kelvin, K), power factor (PF, Watts per meter-square Kelvin, $W/mK^2$) versus temperature (Kelvin, K), lattice thermal conductivity (Watts per meter-Kelvin, W/mK) versus temperature (Kelvin, K), and Figure of Merit (ZT) versus temperature (Kelvin, K), respectively, showing results of measuring Seebeck coefficients, power factors, lattice thermal conductivities, and dimensionless thermoelectric figures of merit of Example 3 and Comparative Example 3.
Figure 9B:
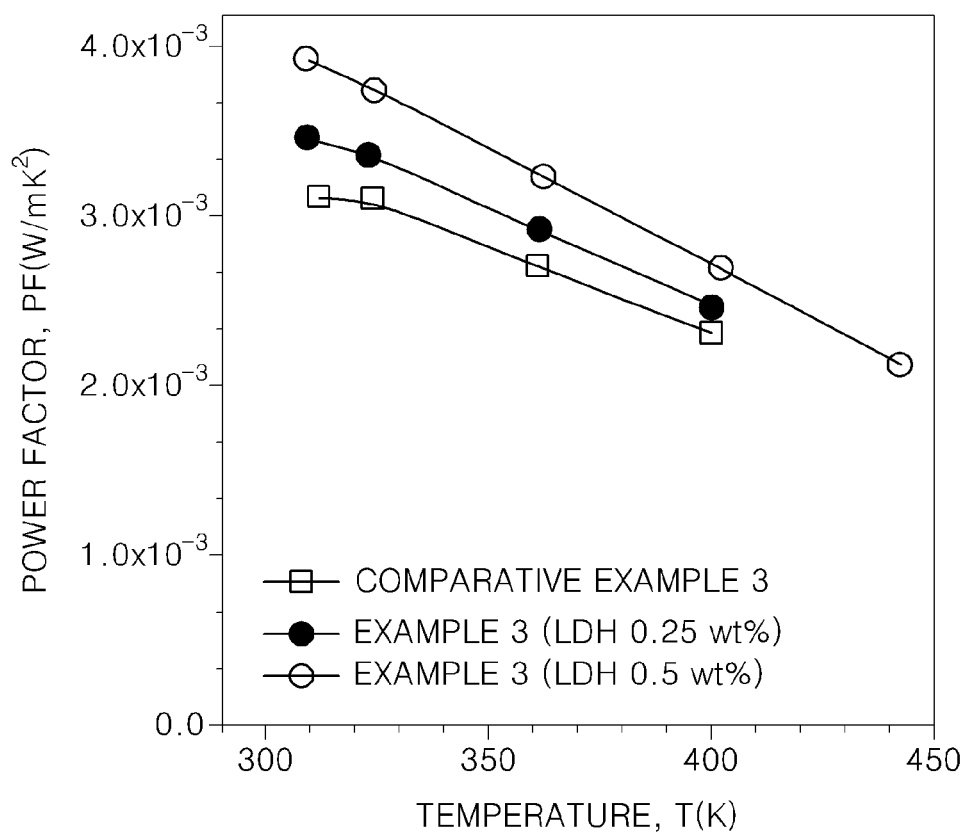
Figure 9C:
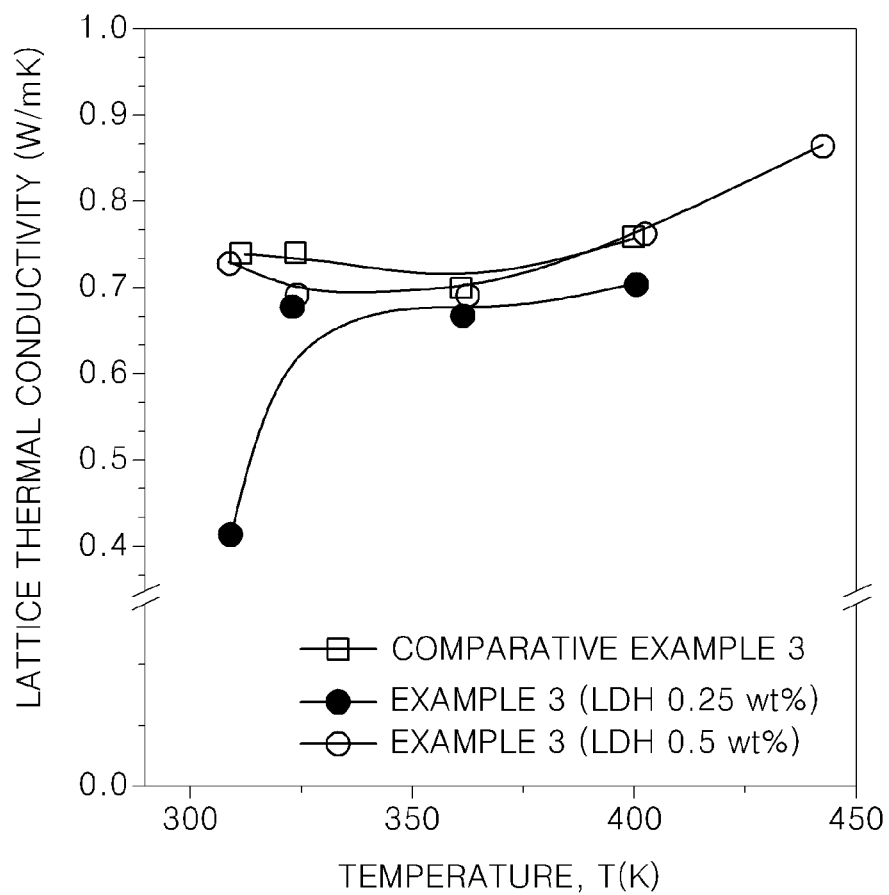
Figure 9D:
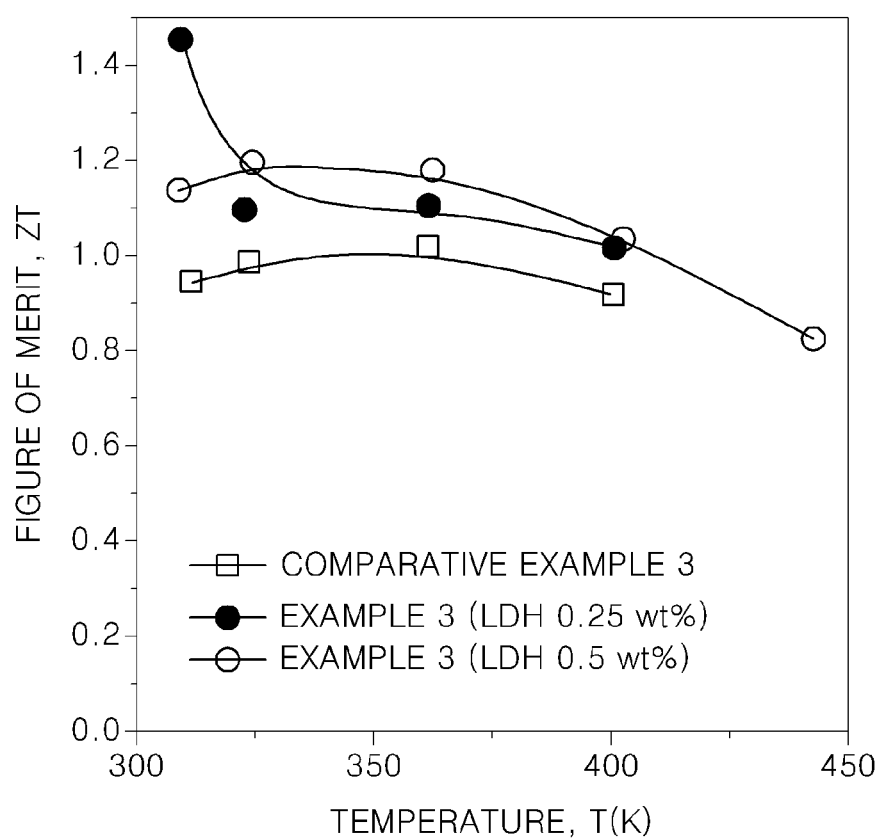
Figure 10A:
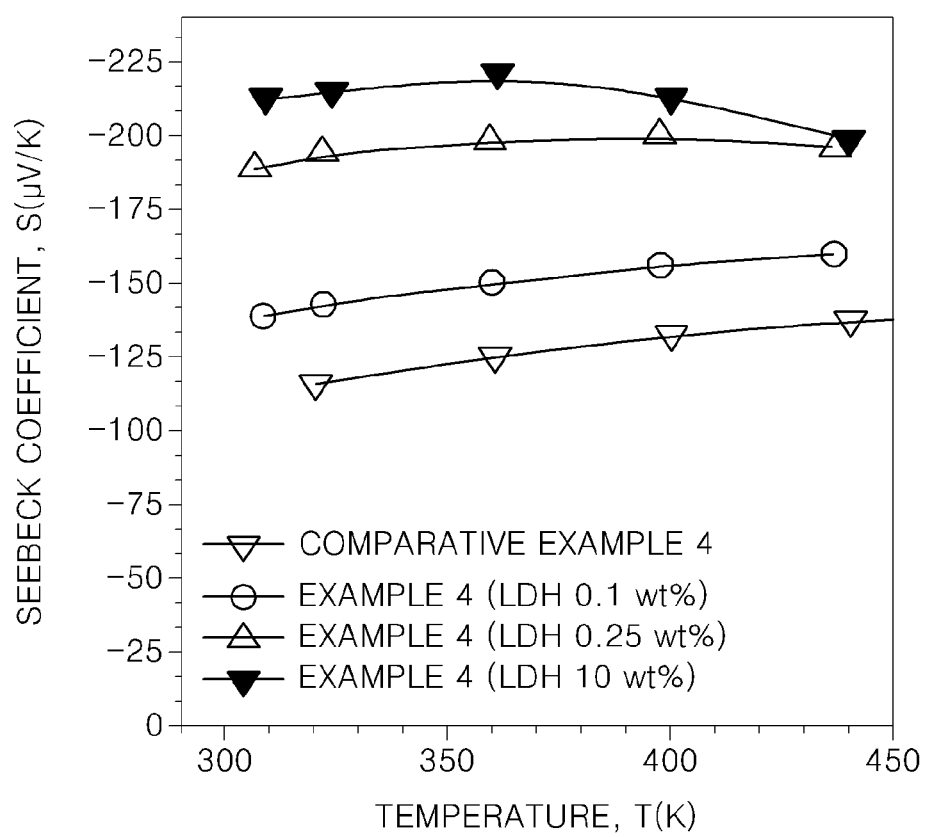
FIGS. 10A through 10D are graphs of Seebeck coefficient (S, microvolts per Kelvin, $\mu V/K$) versus temperature (Kelvin, K), power factor (PF, Watts per meter-square Kelvin, $W/mK^2$) versus temperature (Kelvin, K), thermal conductivity (Watts per meter-Kelvin, W/mK) versus temperature (Kelvin, K), and Figure of Merit (ZT) versus temperature (Kelvin, K), respectively, showing results of measuring Seebeck coefficients, power factors, thermal conductivities, and dimensionless thermoelectric figures of merit of Example 4 and Comparative Example 4.
Figure 10B:
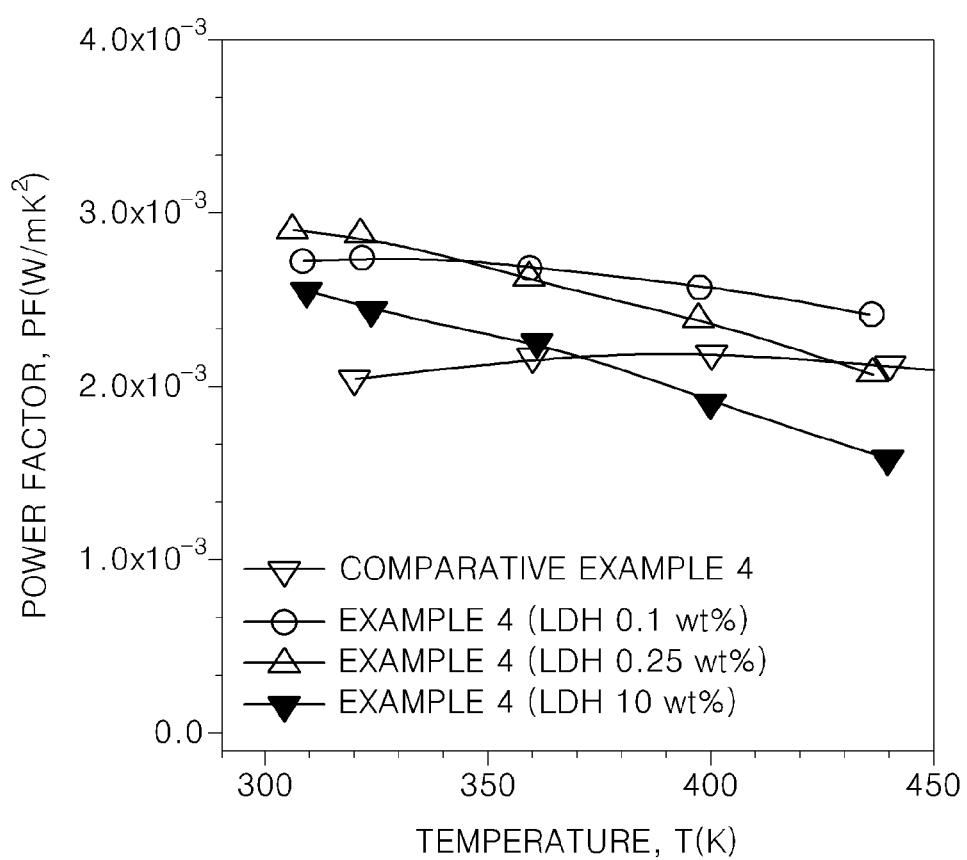
Figure 10C:
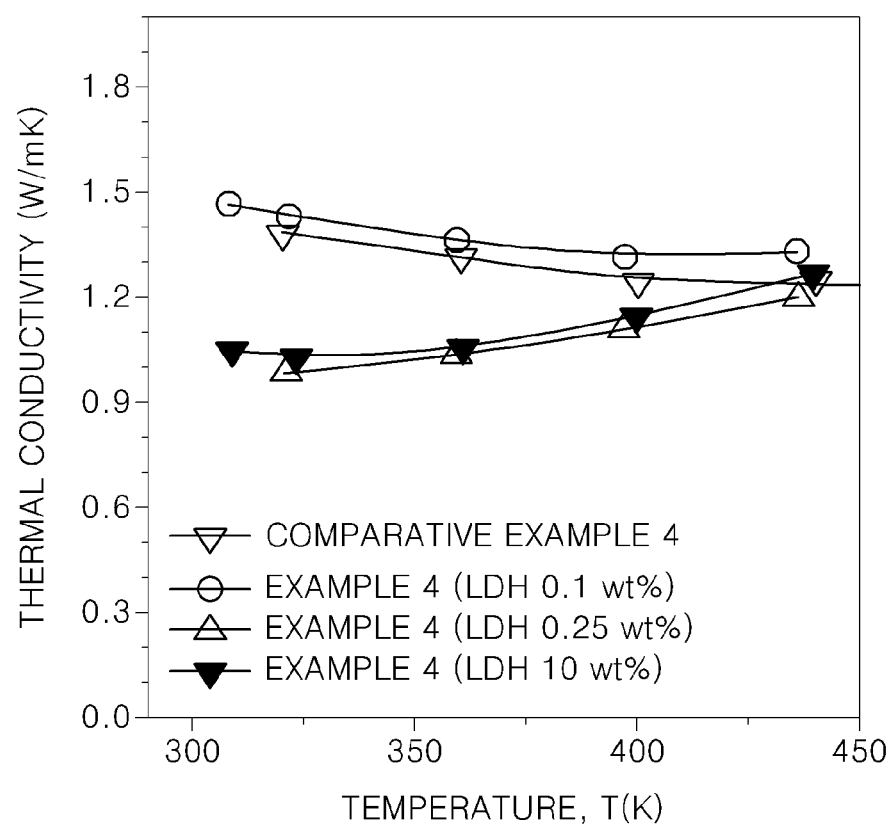
Figure 10D:
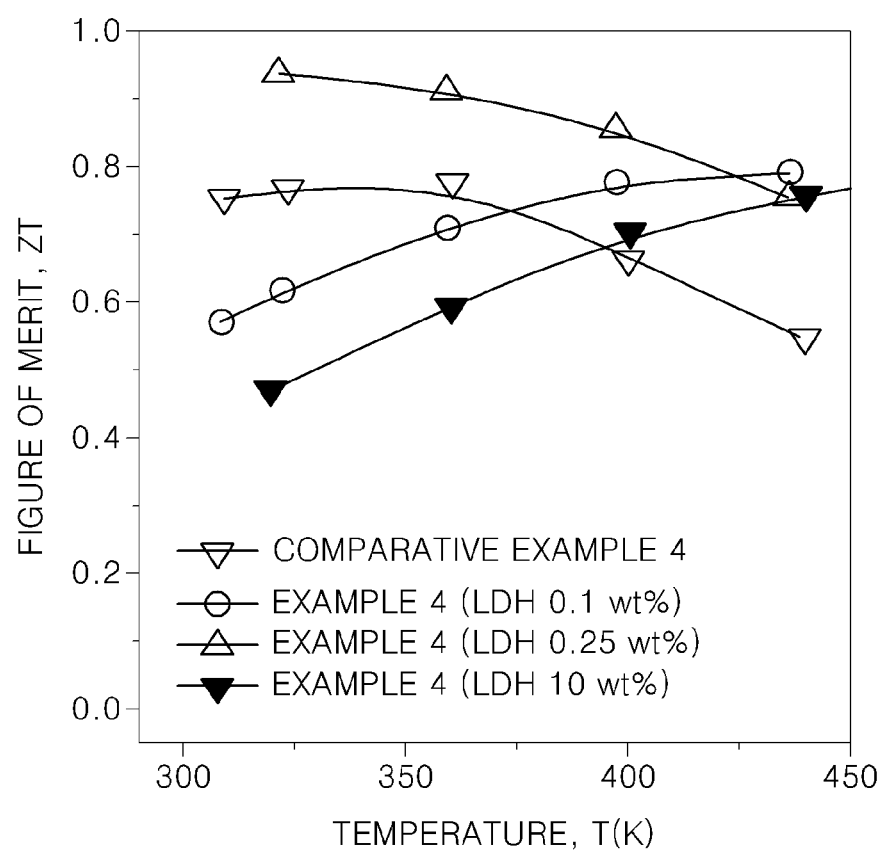

FIGS. 9A through 9D are graphs respectively showing results of measuring Seebeck coefficients, power factors, lattice thermal conductivities, and dimensionless thermoelectric figures of merit of Example 3. As shown in FIGS. 9A through 9D, like Examples 1 and 2, the Seebeck coefficients were increased by using the nanosheet, thereby increasing the power factors, and the thermal conductivities were also decreased, thereby improving the dimensionless thermoelectric figures of merit. A maximum ZT value of the thermoelectric material of Example 3, which was prepared by adding 0.25 wt % of the nanosheet derived from LDH, was 1.45, which is a room temperature ZT value (at 300 K). This ZT is about 80% greater than that provided by Comparative Example 3 (as shown in FIG. 9D). This is understood to be due to the decrease of the lattice thermal conductivity provided by the nanosheet, which is introduced into the thermoelectric semiconductor, the increase in the power factor from a carrier filtering effect generated due to presence of a composition having high electrical conductivity (electrical conductivity up to 700 S/cm), and the inclusion of the nano-scale sheet, which is understood to provide the decrease of the lattice thermal conductivity to ⅔ compared to Comparative Example 3.

FIGS. 10A through 10D are graphs respectively showing results of measuring Seebeck coefficients, power factors, thermal conductivities, and dimensionless thermoelectric figures of merit of Example 4. As shown in FIGS. 10A through 10D, the adding of the nanosheet improves the thermoelectric performance of not only a p-type Bi—Te—Se-containing thermoelectric material, but also an n-type Bi—Te—Se-containing thermoelectric material. Specifically, the Seebeck coefficients were largely increased, and the increase was greater in the n-type Bi—Sb—Te-containing thermoelectric material than in the p-type Bi—Sb—Te-containing thermoelectric material, when the nanosheet was added (see FIG. 10A). Accordingly, the power factor also increases (see FIG. 10B) and the thermal conductivity is decreased (see FIG. 10C), and as a result, the dimensionless thermoelectric figure of merit of the n-type thermoelectric material is remarkably increased (refer to FIG. 10D).

FIGS. 11A and 11B are graphs respectively showing results of measuring thermal conductivities and lattice thermal conductivities of thermoelectric nanocomposites according to added amounts of nanosheet derived from Mg—Al LDH in Example 5. As the amount of the nanosheet derived from the Mg—Al LDH is increased, the thermal conductivity of the thermoelectric nanocomposite is decreased, and this is understood to be because the lattice thermal conductivity decreases as shown in FIG. 11B. Accordingly, by selecting an added amount of nanosheet, intrinsic properties (electrical conductivity, a Seebeck coefficient, and thermal conductivity) of a Bi—Te-containing alloy may be controlled, to provide a material having improved thermoelectric performance.

FIGS. 12A and 12B are graphs respectively showing results of measuring Seebeck coefficients and thermal conductivities of thermoelectric nanocomposites according to addition of nanosheets derived from selected LDHs aside from Mg—Al LDH in Example 5. As shown in FIGS. 12A and 12B, the Seebeck coefficients improved and the thermal conductivity decreased regardless of a type of metal ions of LDH.

The above results of Examples 1 through 5 and Comparative Examples 1 through 5 include selected types and amounts of a nanosheet. Other types and amounts of a nanosheet may be used to provide improved thermoelectric performance by improving characteristics of conduction/photon scattering, a thickness of a nanosheet, and reaction control with a matrix (e.g., the thermoelectric semiconductor) according to a composition of the nanosheet.

As described above, the thermoelectric material according to an embodiment has improved thermoelectric performance by decreasing lattice thermal conductivity or increasing a Seebeck coefficient compared to a general alloy type thermoelectric material. The thermoelectric material can provide a quantum confinement effect or PGEC structure, which is provided in a thin film or in a bulk shape, and can be usefully employed by various thermoelectric devices, such as a micro cooling system, a general-purpose cooling device, an air conditioner, or a cogeneration system.

It should be understood that the exemplary embodiments described herein shall be considered in a descriptive sense only and not for purposes of limitation. Descriptions of features, advantages or aspects within each embodiment shall be considered as available for other similar features, advantages, or aspects in other embodiments.

What is claimed is:

1. A thermoelectric material comprising:
a thermoelectric semiconductor particle; and
a nanosheet disposed in the thermoelectric semiconductor particle,
wherein the nanosheet has a layered structure,
wherein the nanosheet has a dimension less than that of the thermoelectric semiconductor particle, and
wherein the nanosheet comprises a double hydroxide.

2. The thermoelectric material of claim 1, wherein a distance between layers of the layered structure is about 1 to about 40 angstroms.

3. The thermoelectric material of claim 1, wherein an average area of the nanosheet is about 0.0001 to about 100 square micrometers.

4. The thermoelectric material of claim 1, wherein the nanosheet comprises a layered double hydroxide represented by Formula 1:

$$[M^{2+}_{1-x}M'^{3+}_{x}(OH)_2][A^{n-}_{x/n}\cdot mH_2O]$$ 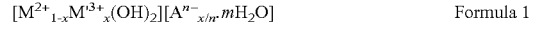

Formula 1 wherein
$M^{2+}$ denotes a divalent metal ion,
$M'^{3+}$ denotes a trivalent metal ion,
$A^{n-}$ denotes an anion having a valence of n,
$0.2 \le x \le 0.33$,
n is an integer from 1 to 3, and
$0.5 \le m \le 4$.

5. The thermoelectric material of claim 4, wherein
$M^{2+}$ is selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof,
$M'^{3+}$ is selected from $Al^{3+}$, $Cr^{3+}$, $Mn^{3+}$, $Fe^{3+}$, $Co^{3+}$, $Ni^{3+}$, $La^{3+}$, and a combination thereof, and
$A^{n-}$ is selected from $CO_3^{2-}$, $OH^-$, $NO_3^-$, $SO_4^{2-}$, $ClO_4^-$, $WO_4^{2-}$, and a combination thereof.

6. The thermoelectric material of claim 1, wherein the thermoelectric semiconductor particle comprises an element selected from a transition metal, a rare earth element, a Group 13 element, a Group 14 element, a Group 15 element, a Group 16 element, and a combination thereof.

7. The thermoelectric material of claim 1, wherein the thermoelectric semiconductor particle comprises a thermoelectric semiconductor selected from a Bi—Te-containing material, a Co—Sb-containing material, a Pb—Te-containing material, a Ge—Tb-containing material, a Si—Ge-containing material, a Sb—Te-containing material, a Sm—Co-containing material, a transition metal silicide-containing material, and a combination thereof.

8. The thermoelectric material of claim 1, wherein an average particle diameter of the thermoelectric semiconductor particle is about 0.01 to about 100 micrometers.

9. The thermoelectric material of claim 1, wherein the nanosheet has a thickness from about 0.1 to about 10 nanometers.

10. The thermoelectric material of claim 1, wherein the nanosheet is disposed on a grain boundary of the thermoelectric semiconductor particle.

11. A thermoelectric element comprising the thermoelectric material of claim 1.

12. The thermoelectric element of claim 11, having a monolithic shape.

13. The thermoelectric element of claim 11, wherein the thermoelectric semiconductor particle forms a matrix, and the nanosheet is dispersed in the matrix.

14. The thermoelectric element of claim 13, wherein the nanosheet is disposed on a grain boundary of the thermoelectric semiconductor particle.

15. The thermoelectric element of claim 11, having a thermal conductivity of less than or equal to 1.0 Watts per meter-Kelvin.

16. A thermoelectric element comprising the thermoelectric material of claim 1.

17. The thermoelectric element of claim 16, having a monolithic shape.

18. The thermoelectric element of claim 16, wherein the thermoelectric semiconductor particle forms a matrix, and the nanosheet is dispersed in the matrix.

19. The thermoelectric element of claim 18, wherein the nanosheet is disposed on a grain boundary of the thermoelectric semiconductor.

20. The thermoelectric element of claim 16, having a thermal conductivity of less than or equal to 1.0 Watts per meter-Kelvin.

21. A thermoelectric module comprising:
a first electrode;
a second electrode facing the first electrode; and
the thermoelectric element of claim 11 disposed between the first electrode and the second electrode.

22. A thermoelectric material comprising:
a thermoelectric semiconductor particle; and
a metal hydroxide nanosheet disposed in the thermoelectric semiconductor particle,
wherein the metal hydroxide has a layered structure, and
wherein a thickness of the metal hydroxide nanosheet is from about 0.1 to about 50 nanometers.

23. The thermoelectric material of claim 22, wherein the metal hydroxide is a layered double hydroxide represented by Formula 1:

$$[M^{2+}_{1-x}M'^{3+}_{x}(OH)_2][A^{n-}_{x/n} \cdot mH_2O] \qquad \text{Formula 1}$$

wherein
$M^{2+}$ denotes a divalent metal ion,
$M'^{3+}$ denotes a trivalent metal ion,
$A^{n-}$ denotes an anion having a valence of n, $0.2 \leq x \leq 0.33$,
n is an integer from 1 to 3, and
$0.5 \leq m \leq 4$.

24. The thermoelectric material of claim 23, wherein
$M^{2+}$ is selected from $Mg^{2+}$, $Ca^{2+}$, $Mn^{2+}$, $Fe^{2+}$, $Co^{2+}$, $Ni^{2+}$, $Cu^{2+}$, $Zn^{2+}$, $Ga^{2+}$, and a combination thereof,
$M'^{3+}$ is selected from $Al^{3+}$, $Cr^{3+}$, $Mn^{3+}$, $Fe^{3+}$, $Co^{3+}$, $Ni^{3+}$, $La^{3+}$, and a combination thereof, and
$A^{n-}$ is selected from $CO_3^{2-}$, $OH^-$, $NO_3^-$, $SO_4^{2-}$, $ClO_4^-$, $WO_4^{2-}$, and a combination thereof.

25. The thermoelectric material of claim 10, wherein a distance between layers of the layered structure is about 1 to about 40 angstroms.

* * * * *